US010224145B2

(12) United States Patent
De Leon et al.

(10) Patent No.: US 10,224,145 B2
(45) Date of Patent: Mar. 5, 2019

(54) EARTH SURFACE POTENTIAL AND HARMONIC MITIGATING TRANSFORMERS

(71) Applicant: NEW YORK UNIVERSITY, New York, NY (US)

(72) Inventors: Francisco De Leon, Bogota, NJ (US); Baris Kovan, Reading, PA (US)

(73) Assignee: NEW YORK UNIVERSITY, New York, NY (US)

( * ) Notice: Subject to any disclaimer, the term of this patent is extended or adjusted under 35 U.S.C. 154(b) by 228 days.

(21) Appl. No.: 15/403,076

(22) Filed: Jan. 10, 2017

(65) Prior Publication Data

US 2017/0213642 A1    Jul. 27, 2017

Related U.S. Application Data

(60) Provisional application No. 62/277,203, filed on Jan. 11, 2016, provisional application No. 62/295,801, filed on Feb. 16, 2016.

(51) Int. Cl.
| | |
|---|---|
| *H01F 27/38* | (2006.01) |
| *H01F 27/34* | (2006.01) |
| *H02J 3/01* | (2006.01) |
| *H02J 50/12* | (2016.01) |
| *H02H 3/00* | (2006.01) |
| *H02H 3/33* | (2006.01) |
| *G01R 31/02* | (2006.01) |

(52) U.S. Cl.
CPC .......... *H01F 27/385* (2013.01); *H01F 27/34* (2013.01); *H02J 3/01* (2013.01); *H02J 50/12* (2016.02); *G01R 31/027* (2013.01); *H02H 3/003* (2013.01); *H02H 3/331* (2013.01)

(58) Field of Classification Search
USPC .................................... 361/35, 62–69, 115
See application file for complete search history.

(56) References Cited

U.S. PATENT DOCUMENTS

| | | | | |
|---|---|---|---|---|
| 5,790,356 A | * | 8/1998 | Bottrell | H02H 7/04 361/115 |
| 2007/0290670 A1 | * | 12/2007 | Lee | H01F 30/12 323/361 |

* cited by examiner

*Primary Examiner* — Danny Nguyen
(74) *Attorney, Agent, or Firm* — Foley & Lardner LLP

(57) ABSTRACT

A transformer assembly comprises at least one transformer having a core. A primary winding is positioned on a first portion, a secondary winding is positioned on a second portion of the core. A neutral winding may be positioned on a third portion of the core. The secondary winding may receive an induced flux produced by an earth surface potential (ESP) via a system ground and/or receive an induced zero sequence flux produced by a non-linear load. The neutral winding may be configured to provide a mitigating flux to the secondary winding. The transformer may also be used as a filter for either GIC or triplen harmonic mitigation. In this case, the primary windings receive the zero sequence current (GIC or triplen harmonics) and the flux may be cancelled in neutral winding such that the zero sequence currents circulate between the zero sequence source and the filter transformer.

20 Claims, 33 Drawing Sheets

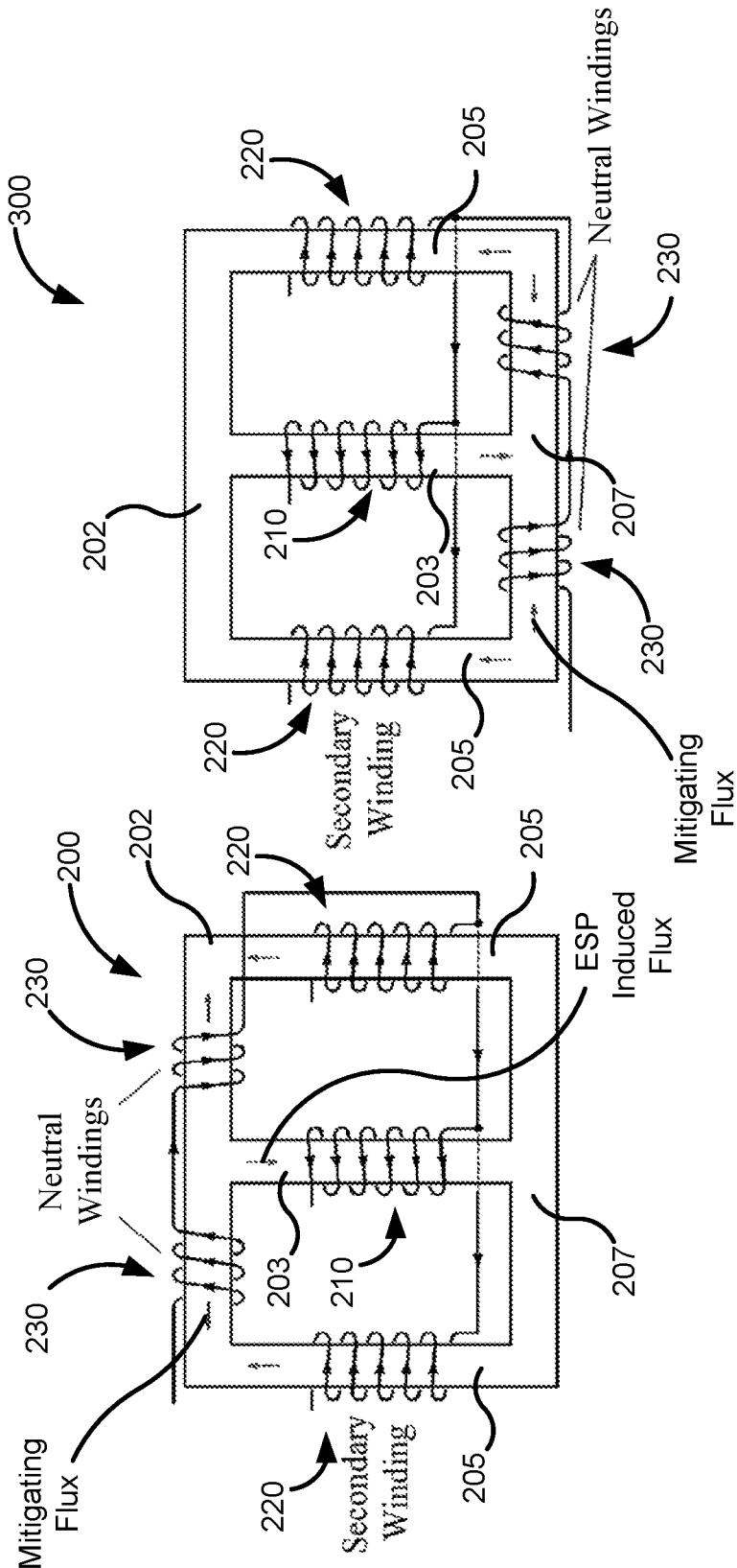

EARTH SURFACE POTENTIAL AND HARMONIC MITIGATING TRANSFORMERS

CROSS-REFERENCE TO RELATED APPLICATIONS

This application claims the benefit of U.S. Provisional Application No. 62/295,801 filed on Feb. 16, 2016, U.S. Provisional Application No. 62/277,203 filed on Jan. 11, 2016 both of which are hereby incorporated by reference in their entireties.

TECHNICAL FIELD

The present disclosure relates generally to transformers and electrical power transfer systems.

BACKGROUND

Wye-connected transformers are often used for power transfer over long distances. Solar activity may cause a potential difference between the neutral point of wye connected transformers. Generally referred to as Earth Surface Potential (ESP), the ESP may cause an induced flux in such power transformers which may produce very low frequency currents called Geomagnetically Induced Currents (GIC). In large power systems, transformer banks such as those formed from three single-phase transformer units may be used due to the large power requirements. In systems where these transformers are connected in a delta-wye configuration, GIC may flow into the transformers through the neutral to ground connection of the wye-connected secondary windings and split into the secondary winding of each single-phase transformer. This may result in a circuit where the ESP and the secondary windings of each transformer are in parallel such that the low frequency ESP may cause a dc shift in the flux and bring the transformer into half-cycle saturation.

Another concern in power transfer systems is harmonics. Harmonics are signals generated in the process of electrical conversion from ac to dc, dc to ac or ac from one frequency to another. Harmonics generated in this process are multiples of the fundamental power system frequency (60 Hz) such as 120 Hz (2nd harmonic), 180 Hz (3rd harmonic), etc. Among these, harmonics that have a frequency multiple of three are called triplen harmonics. Triplen harmonics are more common in buildings (due to fluorescent, power supplies, etc.) while other harmonics such as 5th, 7th, 11th, and 13th are more problematic in industrial applications using Variable Frequency Drives (VFD) for motor speed control. Harmonics cause a number of problems such as hindering the power factor, overheating the transformer, overloading the neutral cable, equipment failure, inefficient operation of motors, false trips (loss of revenue), non-compliance with standards, and flickering in parallel connected circuits. It is estimated that 70% of distribution loads involve electronics that generate some form of harmonics. As per IEEE Std. 519, the total harmonic distortion has to be limited to 5% of the fundamental current at point of interconnection.

Furthermore, a key concern in delta connected power systems is the lack of reference to ground for ground fault detection, safety and insulation concerns. Such delta connected power systems may, for example be used in wind farm applications where the wind turbine transformers are configured in a star/delta configuration, which may be collected through one or more transmission lines to a substation step up delta-wye transformer. Such power transfer systems may suffer from instability in the voltage transfer signal, insulation failure, and failure to detect ground faults.

SUMMARY

Embodiments described herein relate generally to transformers and power transfer systems and in particular, to transformers that include a neutral winding configured to mitigate an induced flux caused by ESP. Embodiments described herein also relate generally to power transfer systems that include a neutral winding in a distribution transformer secondary and/or a filter type transformer connected close to the load in parallel thereto and configured to mitigate harmonics by recirculating the harmonics through the filter transformer instead of a step down transformer. Furthermore, embodiments described herein also relate to systems and methods for using a grounding transformer to provide a reference ground to ungrounded power systems.

In some embodiments, a transformer assembly comprises at least one transformer. The at least one transformer comprises a core. A primary winding is positioned on a first portion of the core and a secondary winding is positioned on a second portion of the core. A neutral winding is positioned on a third portion of the core. The secondary winding receives an induced flux produced by an earth surface potential (ESP) via a system ground. The induced flux has a first direction. The neutral winding is configured to provide a mitigating flux to the secondary winding. The mitigating flux has a second direction opposing the first direction of the induced flux so as to mitigate the induced flux.

In some embodiments, a power transfer system comprises an electric source and an electric load. A step down transformer electrically couples the electric source to the electric load via electric lines. The step down transformer is configured to reduce a first voltage provided by the electric source to a second voltage compatible with an operational voltage of the electric load. The power transfer system also includes a filter transformer comprising a core. At least one primary winding is positioned on a first portion of the core. The at least one primary winding is electrically coupled to the electric lines between the step down transformer and the electric load. At least one neutral winding is positioned on a second portion of the core. The at least one neutral winding is electrically coupled to the primary winding and a system ground. The filter transformer is configured to provide a low impedance path so as to allow harmonics to circulate between the filter transformer and the load instead of flowing into the step down transformer.

It should be appreciated that all combinations of the foregoing concepts and additional concepts discussed in greater detail below (provided such concepts are not mutually inconsistent) are contemplated as being part of the subject matter disclosed herein. In particular, all combinations of the claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 18A and FIG. 18B are embodiments of transformers that include a neutral winding positioned on a yoke or a core of the transformers.

Figure 1:
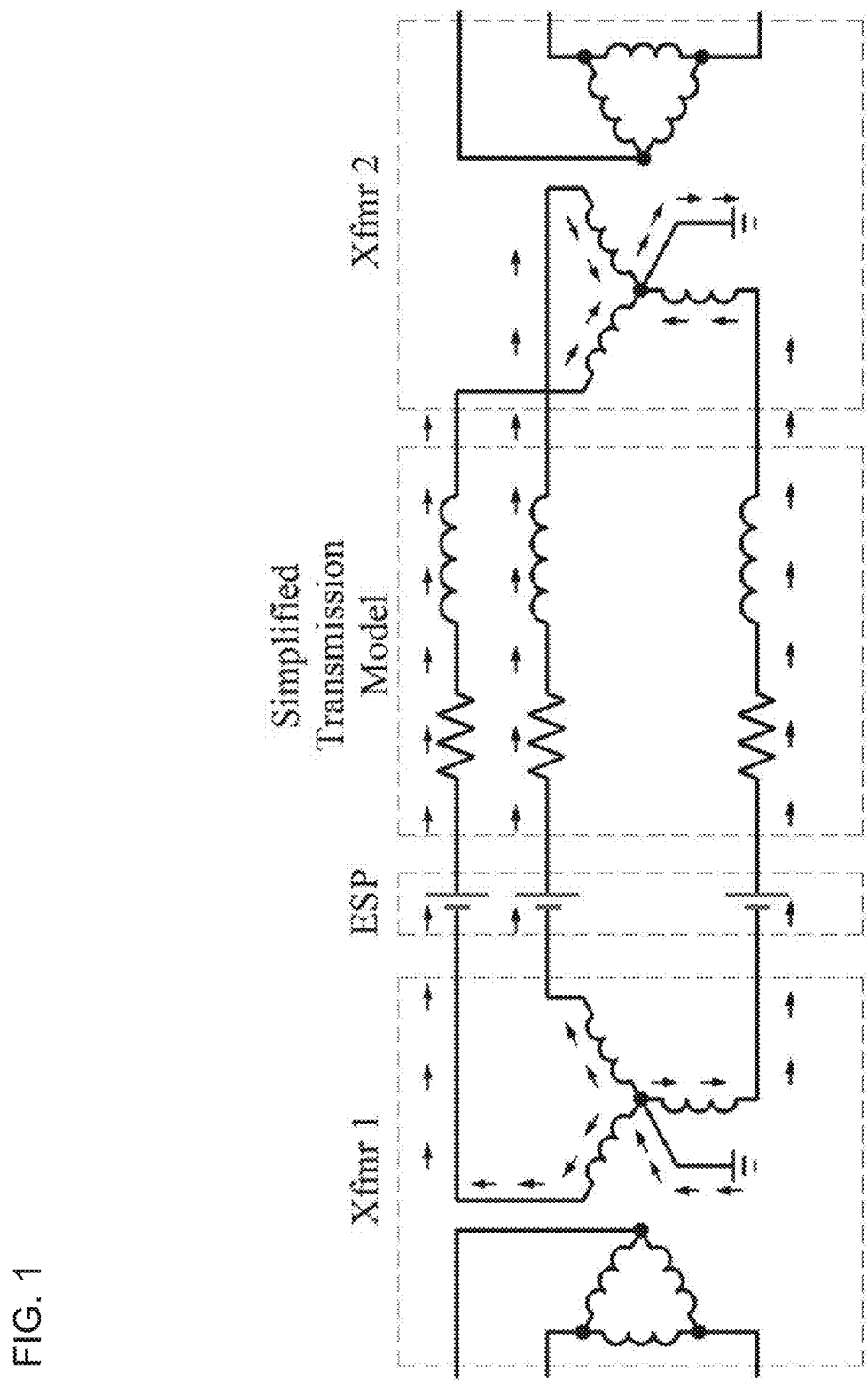
FIG. 1 is a simplified circuit diagram of a two terminal power transfer system including wye connected transformers showing the direction of GIC flow in the system.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to transformers and power transfer systems and in particular, to transformers that include a neutral winding configured to mitigate an induced flux caused by ESP. Embodiments described herein also relate generally to power transfer systems that include a neutral winding in a distribution transformer secondary and/or a filter type transformer connected close to the load in parallel thereto and configured to mitigate harmonics by recirculating the harmonics through the filter transformer instead of a step down transformer. Furthermore, embodiments described herein also relate to systems and methods for using a grounding transformer to provide a reference ground to ungrounded power systems Section I: Mitigating GIC Induced by ESPs in Transformer Assemblies.

Wye-connected transformers are often used for power transfer over long distances. Solar activity may cause a potential difference between the neutral point of wye connected transformers. An example wye connected transformer assembly is shown in FIG. 1 ("transformer" abbreviated as "Xfmr" in Figures). Generally referred to as Earth Surface Potential (ESP), the ESP may cause an induced flux in such power transformers which may produce very low frequency currents called Geomagnetically Induced Currents (GIC). In large power systems, transformer banks such as those formed from three single-phase transformer units may be used due to the large power requirements. In systems where these transformers are connected in delta-wye, GIC may flow into the transformers through the neutral to ground connection of the wye-connected secondary windings and splits into the secondary winding of each single-phase transformer. This results in a circuit where the ESP and the secondary windings of each transformer are in parallel such that the low frequency ESP may cause a dc shift in the flux and bring the transformer into half-cycle saturation.

Mitigation of the ESP induced GIC may be accomplished via the installation of a capacitor-based blocking device between the neutral of the transformer bank and ground. The major drawback of the capacitor-based method is that it may block the GIC completely eliminating the problem in the protected lines, but forcing the GIC into other parts of the system which may cause augmented adverse effects such as harmonics, reactive power demand, and transformer hotspot. In addition, ferro-resonance can become a problem if capacitors are installed system wide.

Certain embodiments of the transformer assemblies described herein include a neutral winding positioned on at least a portion of the transformer. Such transformer assemblies may provide several benefits including, for example: (1) providing a mitigating flux via the neutral windings so as to oppose and mitigate an induced flux caused by ESP, thereby producing transformers immune to half-cycle saturation; (2) providing neutral windings without significant modifications to existing transformer assembly configurations; (3) using the ESP to produce the mitigating flux such that an external voltage producing source or other components (e.g., capacitors, control circuitry, etc.) for producing the mitigating flux may be excluded; (4) reducing the cost of GIC mitigation via the elimination of the voltage producing source or other components; and (5) effectively reducing fault currents involving zero-sequence currents, for example up to 50% reduction for single-line to ground and 75% reduction for double-line to ground systems.

Figure 2:
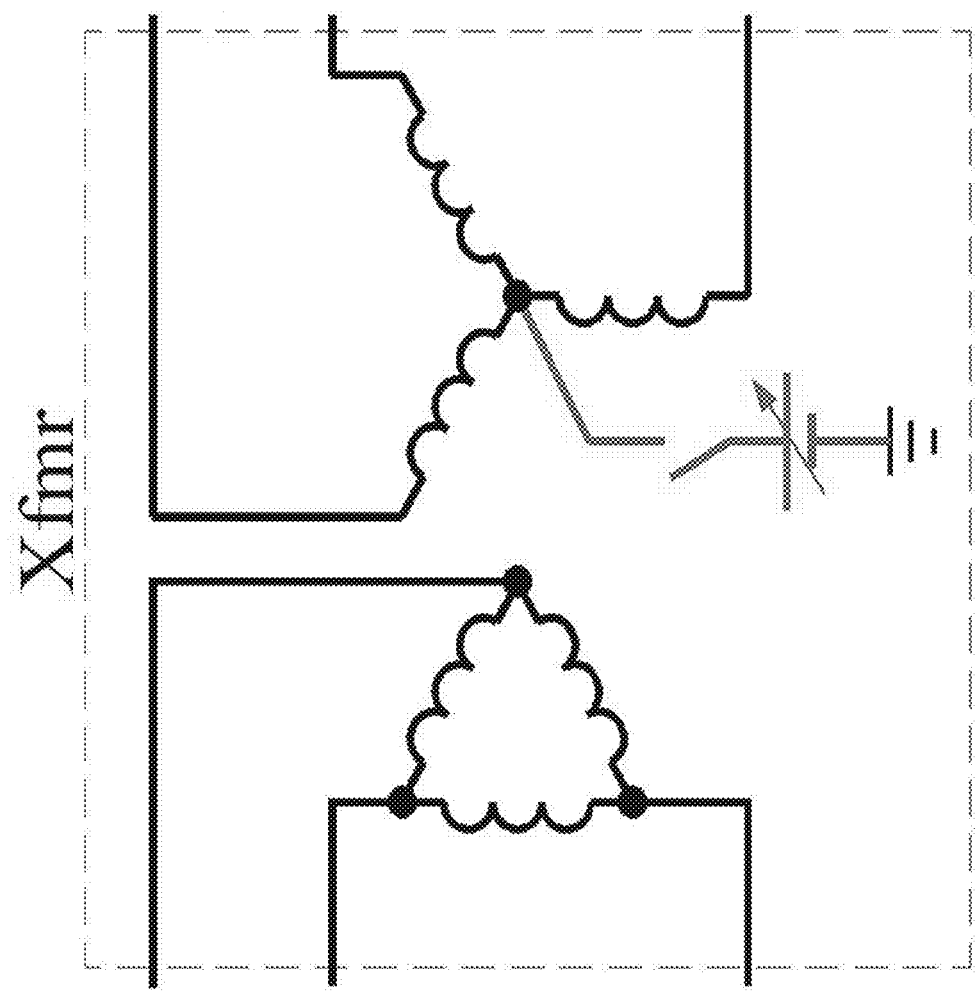
FIG. 2 is a circuit diagram of a virtual variable DC source connected to a neutral of a transformer.

In various embodiments, half-cycle saturation caused by a geomagnetic disturbance (GMD) event such as an ESP may be overcome with a variable dc voltage source placed in the neutral of a transformer as shown in FIG. 2. The frequency and the magnitude of the dc voltage generator may have to be adjusted such that the total dc voltage drop across the local and remote terminals is zero. This may cancel the flow of GIC and would in turn mitigate the half-cycle saturation.

Various embodiments of the transformer assemblies described herein include at least one transformer which may include a core, a primary winding positioned on a first portion of the core, and a secondary winding positioned on a second portion of the core. The second portion may be the same or may be different from the first portion. Furthermore, a neutral winding may be positioned on a third portion of the core. The third portion may be the same or may be different from the first portion and/or the second portion. The secondary winding receives an induced flux produced by an earth surface potential (ESP) via a system ground. The induced flux has a first direction. The neutral winding is configured to provide a mitigating flux to the secondary winding. The mitigating flux has a second direction opposing the first direction of the induced flux so as to mitigate the induced flux.

In some embodiments, the one or more transformers included in the transformer assembly may include at least one primary leg and at least one secondary leg. The first portion may be located on the at least one primary leg. The second portion may be located on the at least one secondary leg. Furthermore, the third portion may be also located on the at least one secondary leg.

Figure 3:
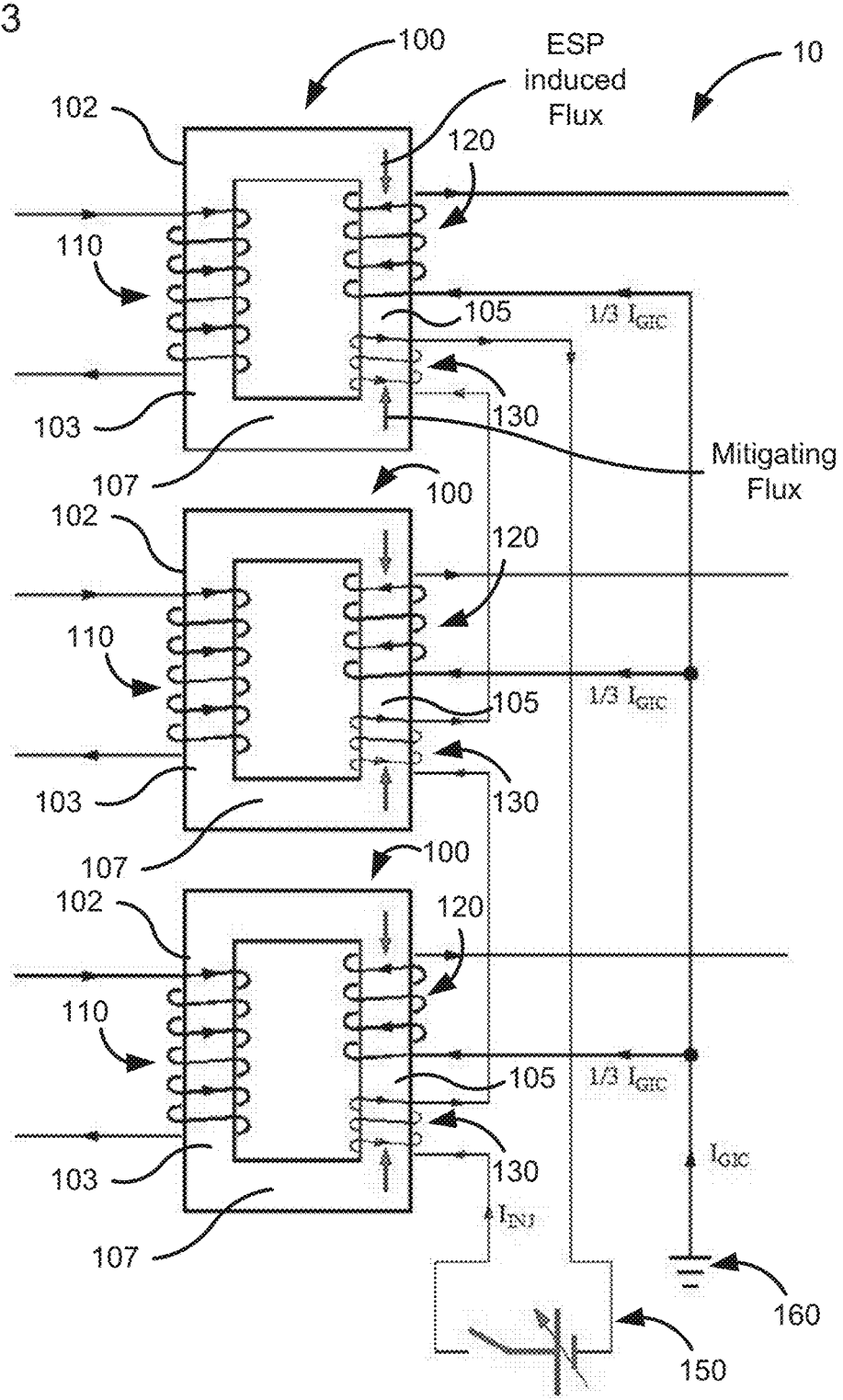
FIG. 3 is a schematic illustration of an embodiment of a transformer assembly including three transformers, each of which includes a neutral winding coupled to an external DC source.

For example, FIG. 3 is a simplified circuit diagram of a three single phase transformer assembly 100 that may include three transformers 100 arranged in a parallel configuration. Each of the transformers 100 include a core 102 including a primary leg 103, a secondary leg 105 and a pair of yokes 107 coupling the primary leg 103 to the secondary leg 105 and positioned orthogonal (e.g., at an angle of about 90 degrees) thereto. The ends of the yokes 107 are coupled to the ends of the primary leg 103 and the secondary leg 105 so that the core 102 is shaped as a rectangular ring. In other embodiments, the core 102 may have any suitable shape, for example a U-shaped core, a circular core, a toroidal core, a square core, etc.

A primary winding 110 may be positioned (e.g., wound) on the primary leg 103 of each of the transformers 100. The primary winding 110 may be wound about the primary leg 103 in a first rotational direction (e.g., clockwise direction). A secondary winding 120 may be positioned (e.g., wound) on a secondary portion of the secondary leg 105 of each transformer 100. The secondary winding 120 may be wound about the secondary leg 105 in a second rotational direction (e.g., a counter clockwise direction) which may be opposite to the first rotational direction of winding of the primary winding 110. In other embodiments, the primary windings 110 and the secondary windings 120 may be positioned on the same leg (e.g., the primary leg 103 or the secondary leg 105), on top of each other or in any other suitable configuration.

At least one end of the secondary winding 120 is electrically coupled to the system ground 160. In the event of a GMD, an ESP may be produced in the system ground 160 which may produce an induced flux in the transformer 100. The induced flux may cause a GIC current $I_{GIC}$ to flow towards the secondary winding 120 as shown in FIG. 3. A neutral winding 130 is also positioned (e.g., wound) on a neutral portion of the secondary leg 105. The neutral winding 130 may be wound in a third rotational direction opposite the second rotational direction (e.g., in a clockwise direction) of the secondary winding 120. In various embodiments, the neutral winding 130 may be positioned on the same leg as the primary windings 110 and/or the secondary windings 120 or on top of (e.g., wound around) any one of the primary windings 110 and/or the secondary windings 120, or in any other suitable configuration.

The neutral winding 130 is configured to produce a mitigating flux in a direction opposing a direction of the induced flux caused by the ESP. The mitigating flux may provide a mitigating current in a direction opposing the GIC as shown in FIG. 3 so as to cancel the GIC and negate any harmful effects thereof. For example, a voltage source 150 (e.g., a dc voltage source) may be coupled to the neutral winding 130 so as produce the mitigating flux. Since the voltage source 150 is electrically isolated from the system ground 160, it may reduce the complications associated with generator voltage control, complicated system fault protection, protection of the voltage source itself (e.g., from the ESP) and/or insulation coordination. In some embodiments, the voltage source 150 may include control circuitry (not shown) configured to adjust a voltage and/or a current produced by the voltage source 150 so as to match the induced flux/GIC caused by the ESP.

In some embodiments, the neutral windings 130 may be electrically coupled to the system ground 160 so as to also receive the ESP (and thereby, the GIC) therefrom. The ESP may produce the mitigating flux in the neutral windings 130 so as to mitigate (e.g., reduce the induced flux or GIC by 50-100% (e.g., 50, 60, 70, 80, 90 or 100% inclusive of all ranges and values therebetween)). This obviates the use of an external voltage source to produce the mitigating flux.

Figure 4:
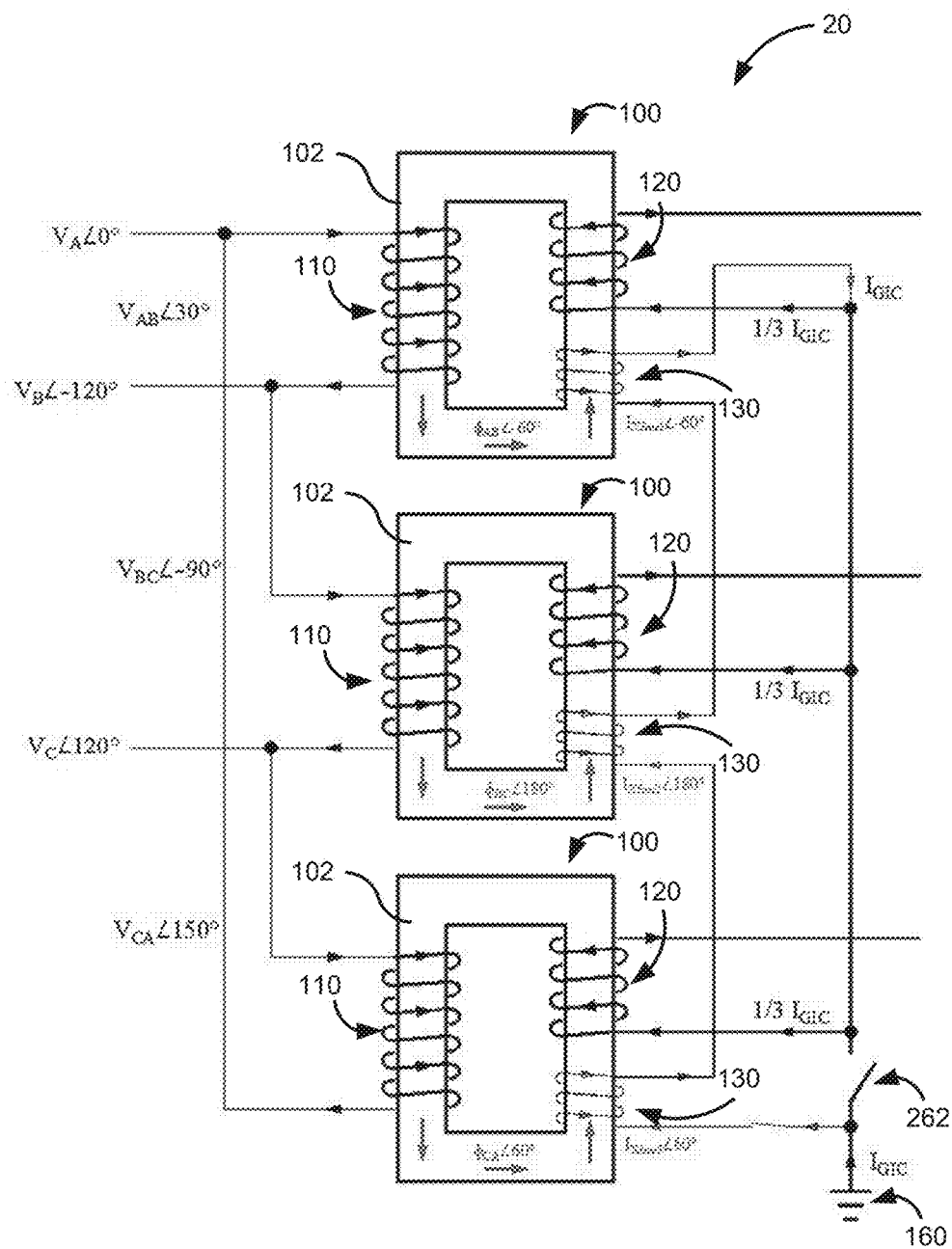
FIG. 4 is a schematic illustration of another embodiment of a transformer assembly including the transformers of FIG. 3 coupled to a system ground.

For example, FIG. 4 is schematic circuit diagram of a three phase transformer assembly 20 which includes the three transformers 100 arranged in parallel (one transformer per phase), as described with respect to FIG. 3. However, instead of coupling the neutral windings 130 to the dc source 150, the neutral windings 130 are coupled to the system ground 160 so as to also receive the induced flux/GIC. As described before, the induced flux/GIC causes the neutral windings 130 to produce the mitigating flux opposing the induced flux produced by the same ESP/GIC.

In the three phase configuration of the transformer assembly 20, each of the three transformers 100 are arranged in parallel. Therefore, each transformer 100 receives one third of the GIC. In various embodiments, the neutral winding 130 has one third the number of windings relative to the secondary winding 120 so as to produce a mitigating flux (and thereby, a mitigating current) matching the induced flux/GIC passing through each of the secondary winging 120.

In some embodiments, the transformer assembly 20 also includes a switch 262 positioned within an electrical line coupling the neutral winding 130 to the system ground 160. The switch 262 may be configured to selectively couple the neutral windings 130 to the system ground 160 such that the neutral windings 160 may only be brought in line when a GMD event is occurring or has occurred.

Figure 5:
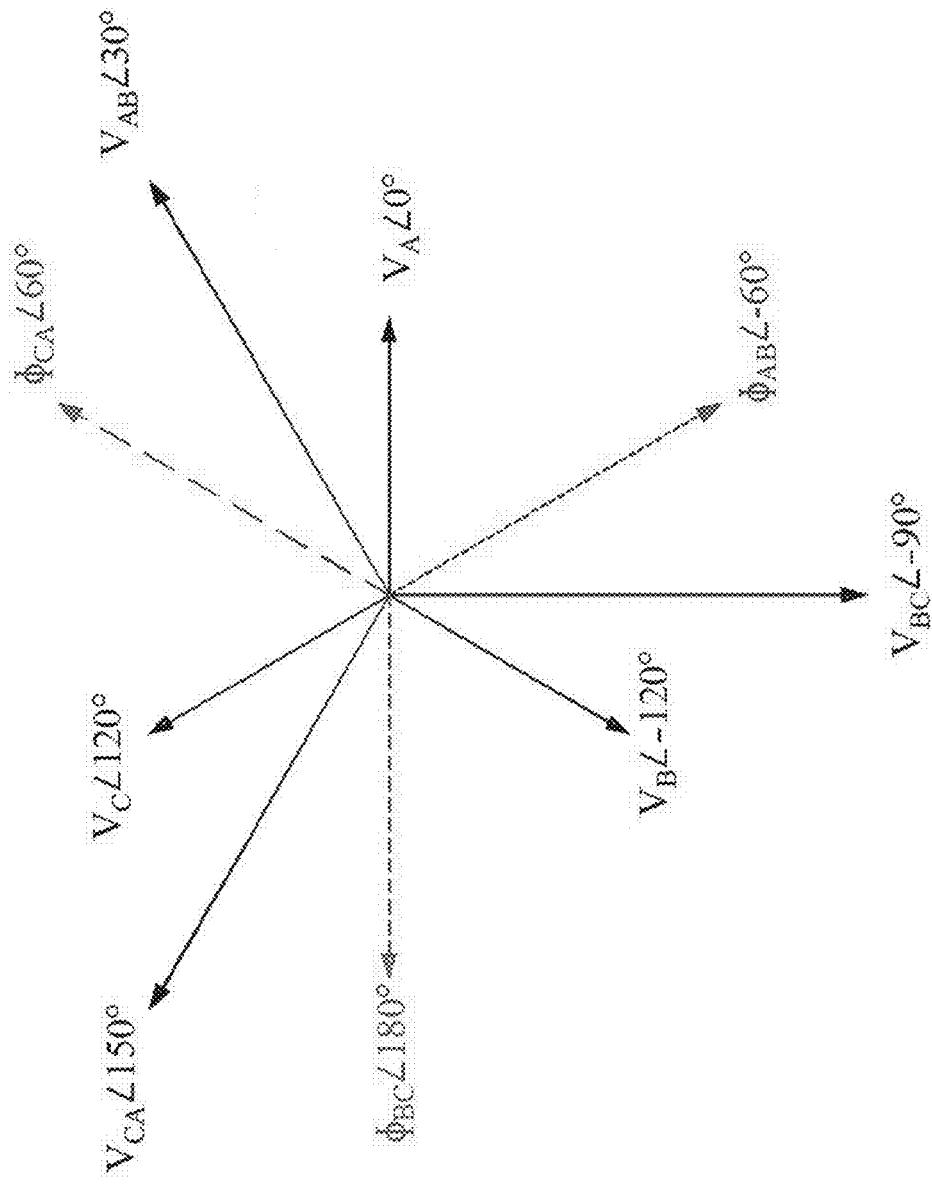
FIG. 5 is a phasor diagram showing primary voltages and induced flux in each phase.

Expanding further, the transformers 100 included in the transformer assembly 20 connect the ESP across the core 102 of each transformer 100 by winding the neutral winding 130 which serves as the neutral to a ground conductor around each core 102 in the opposite direction to that of the secondary winding 120. The mitigating current produced by the neutral windings 130 and the induced current in the neutral windings 130 due to the induced flux may oppose each other (e.g., are 120 degrees apart) and in series, and therefore may cancel each other. Hence, the neutral winding 130 only provides dc flux injection while blocking the induced current due to induced flux caused by the ESP. The phasor diagram shown in FIG. 5 shows the system voltages and induced flux. FIG. 6A shows the induced currents due to the induced flux on each neutral winding 130 and FIG. 6B shows the associated phasor diagram.

Figure 6B:
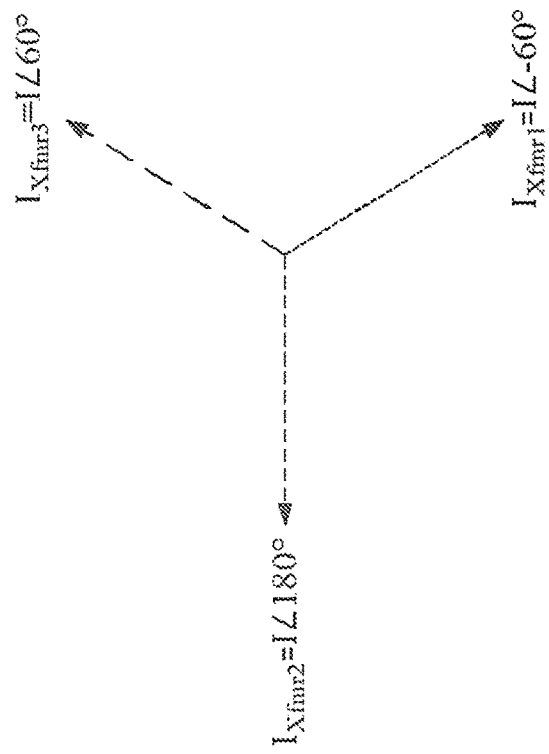
FIG. 6A is a simplified circuit diagram showing induced currents in neutral windings of a transformer of FIG. 3 or 4 and FIG. 6B is the associated phasor diagram.
Figure 6A:
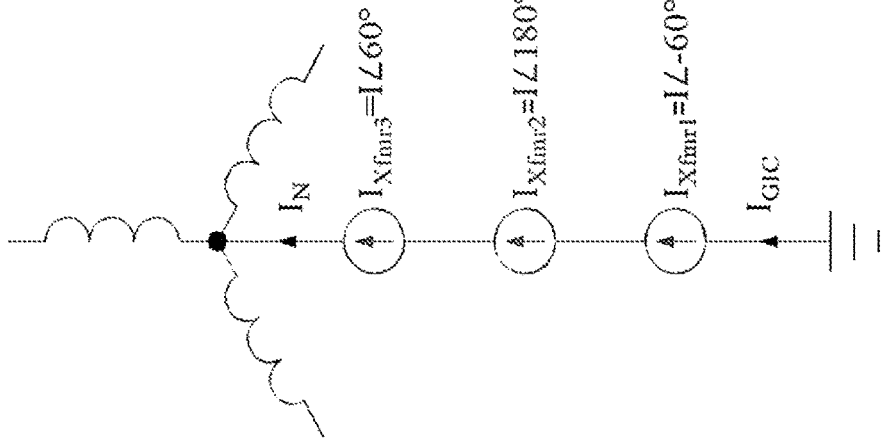

As seen in FIGS. 6A and 6B, the injected currents in each neutral winding 130 appear between the neutral and the ground. The total induced currents due to the induced flux in each neutral winding 130 may cancel out as shown in the following expression:

$$I_{Induced(Total)} = I_{induced(A)} + I_{induced(B)} + I_{induced(C)} \quad (1)$$

$$I_{Induced(Total)} = I\angle -60° + I\angle 60° + I\angle 180° = 0 \quad (2)$$

The neutral winding 130 may be wound in a third rotational direction opposite to the second rotational direction of winding of the secondary winding 120 so as to enable the opposing effect to the induced flux caused by the ESP. In addition, the number of turns of the neutral windings 130 may be determined with respect to the number of secondary winding 120 turns. For example, the neutral winding 130 may have exactly one third of the secondary windings 120 turns to establish exactly the same magnetomotive force (mmf) based on the following equation (3):

$$N_{SEC} * \frac{I_{GIC}}{3} = N_{Tertiary} * I_{GIC} \quad (3)$$

$$N_{Tertiary} = \frac{N_{SEC}}{3} \quad (4)$$

The transformer assembly 20 shown in FIG. 4 may be realized by either permanent or temporary connection of the neutral winding. Permanent connection of the neutral windings 130 may provide the following advantages, for example: (1) allow excluding of by-pass circuit including, for example control circuit, circuit breaker, fast-by pass switch, surge arrester/air gap etc.; (2) reducing or elimination monitoring, control, or maintenance after installation; (3) reducing zero sequence currents in the case of faults due to the inductance of the neutral windings; and (4) eliminating the use of one or more reactors in the neutral.

However, the neutral windings 130 may have to be sized to withstand short circuit currents. Therefore, the size of the neutral windings 130 may have to be sufficiently robust. This may increase the size of the transformers 100 which may cause complications in construction and increase the initial cost. The resistance of the neutral windings 130 and the leakage inductance with respect to the other windings may also have to be carefully designed since they may hinder the sensitivity of the protection system for ground faults. However, varying the resistance of the neutral windings 130 does not affect the half-cycle mitigation. Hence, it makes it easy to achieve the desirable neutral to ground resistance avoiding an additional installation if deemed necessary. In addition, the winding position of the primary windings 110, the secondary windings 120 and the neutral windings 130 may serve as a design parameter such that the air core and leakage inductances are adjustable for the desired level of reactance in the neutral.

As shown in FIG. 4, the transformer assembly 20 may include the switch 262 for selectively coupling the neutral windings 130 to the system ground 160 only when the GIC is present. This may allow smaller size of the neutral windings 130, thereby enabling smaller and less expensive transformer 100 design. The neutral windings 130 may be switched on and off automatically or manually using the switch 262 while monitoring the half-cycle saturation. However, ground to neutral around the neutral windings 130 may be by-passed in the event of a fault.

Figure 7:
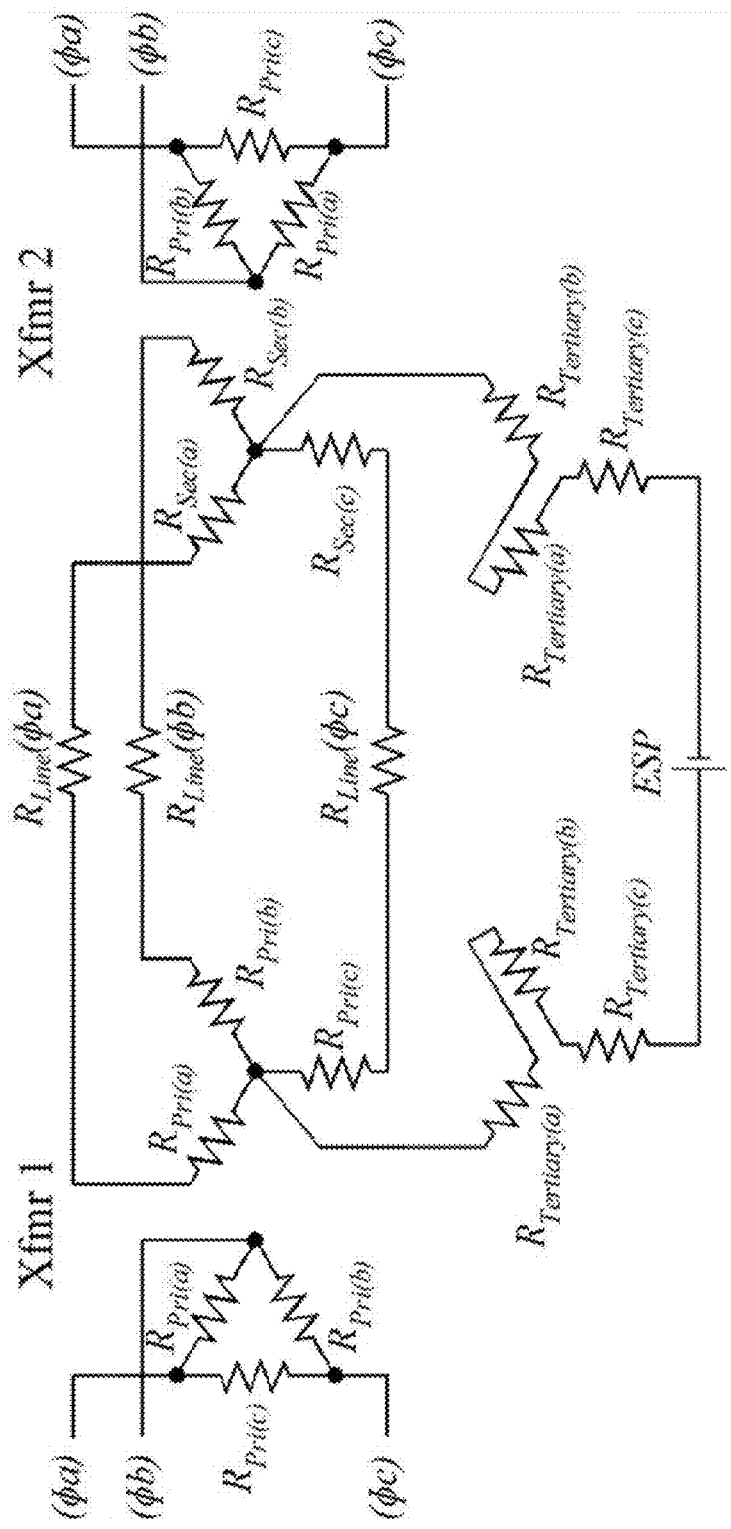
FIG. 7 is a circuit diagram showing a configuration of power system resistances of the transformer assembly of FIG. 3 or 4.

In either permanent or temporary connection configurations, the neutral windings 130 may appear in series between the neutral of the transformer 100 bank and the system ground 160. FIG. 7 shows the entire circuit of a two bus system with respect to dc resistances. The effects of the ESP have been concentrated in a GMD voltage source connected between the grounding points of the transformers on both sides of the transmission line.

Simulation Examples

Figure 8:
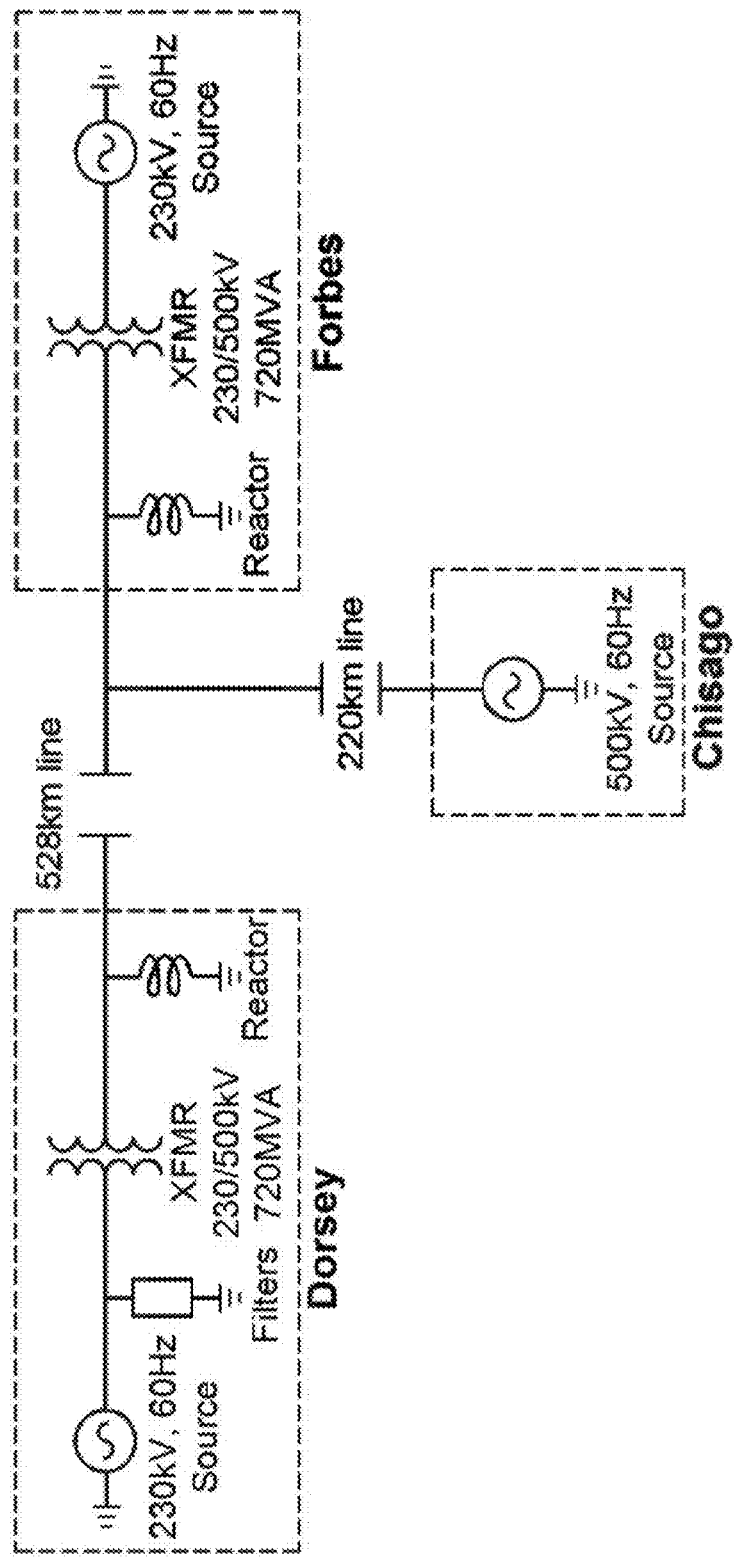
FIG. 8 is a simplified one line circuit diagram of a power transfer system that connects three utility companies (Dorsey-Forbes-Chisago) and includes the ESP mitigating transformer assembly of FIG. 4.

FIG. 8 is a simplified one line circuit diagram of a power transfer system that connects three utility companies (Dorsey-Forbes-Chisago) and includes the ESP mitigating transformer assembly of FIG. 4. The system of FIG. 8 includes a 230/500 kV system that connects three utility companies: Manitoba Hydro (Dorsey), Excel Energy (Forbes) and Minnesota Power (Chisago). A minor modification applied to the system is that the transformer 46 kV side is omitted since it does not have an effect on the results. Transformers are connected in delta-wye to isolate all zero sequence currents in the 500 kV network.

Figure 9:
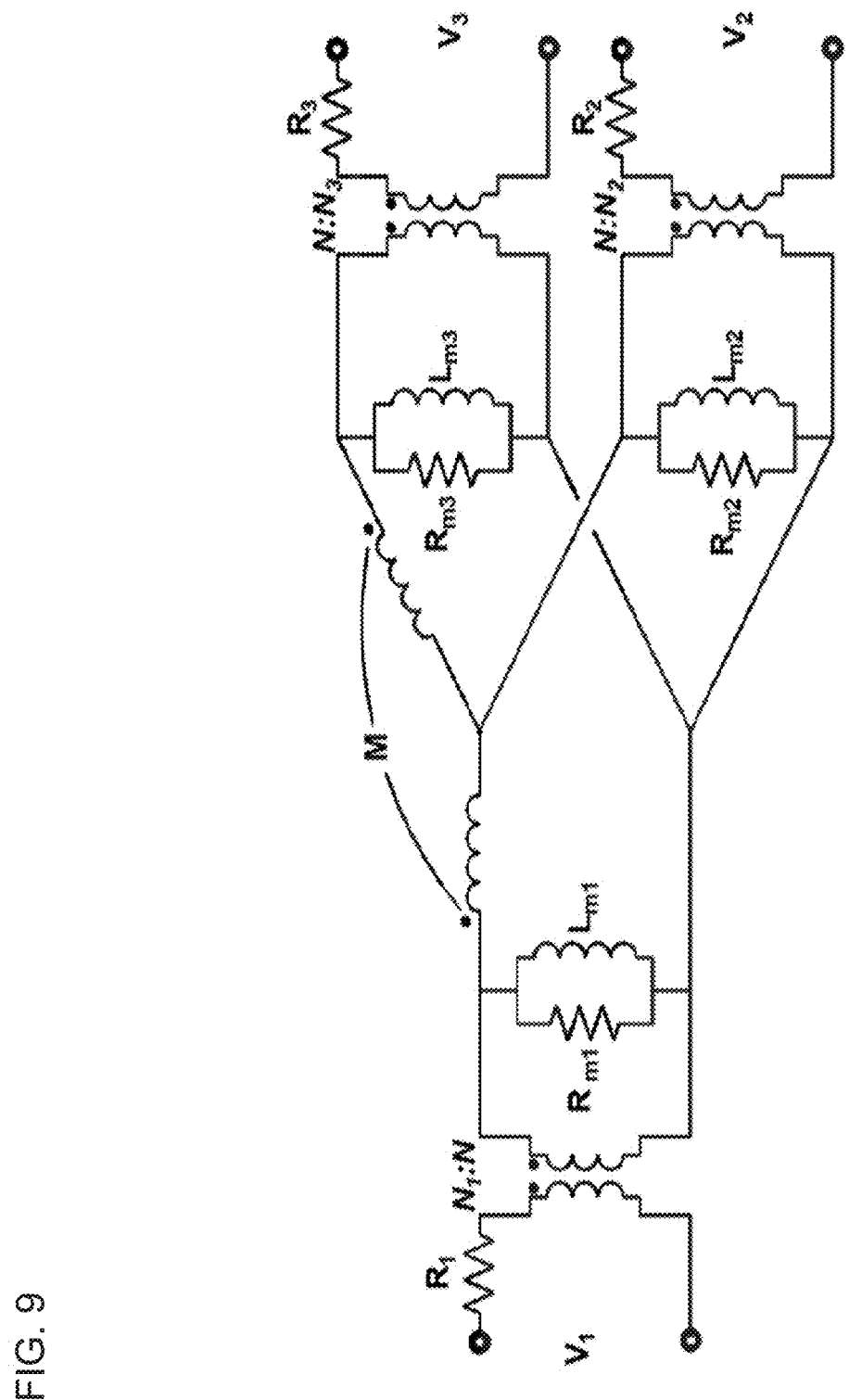
FIG. 9 is a circuit diagram showing a duality-delivered model for a single-phase three winding transformer.

ESP is expected to be between 1.2 and 6 V/km. The upper boundary of this range is selected to achieve half-cycle saturation quickly and to demonstrate the effectiveness of the proposed mitigation technique. Therefore, a 3,000 Vdc between Dorsey and Forbes is used. Transient simulations are conducted in the electromagnetic transients program (EMTP) where the transformer is modeled as a bank of three single-phase transformers connected in a delta-wye configuration. Each single-phase transformer is modeled using the three-winding model to make sure the saturation characteristics are properly considered. Hence, there are three magnetizing branches per each single phase transformer and the leakage inductance is modeled as two mutually coupled inductors. The model for one of the single phase transformers is shown in FIG. 9 where $L_{m1}$, $L_{m2}$ and $L_{m3}$ are the components of the dual model for the magnetizing inductance of the transformer. A standard transformer with equal yoke and leg length is assumed and associated ratios given by:

$$L_{m1} = L_{m3} = \left(\frac{12}{5}\right) L_m \quad (5)$$

$$L_{m2} = 6 L_m \quad (6)$$

GIC Mitigation Performance

Figure 10:
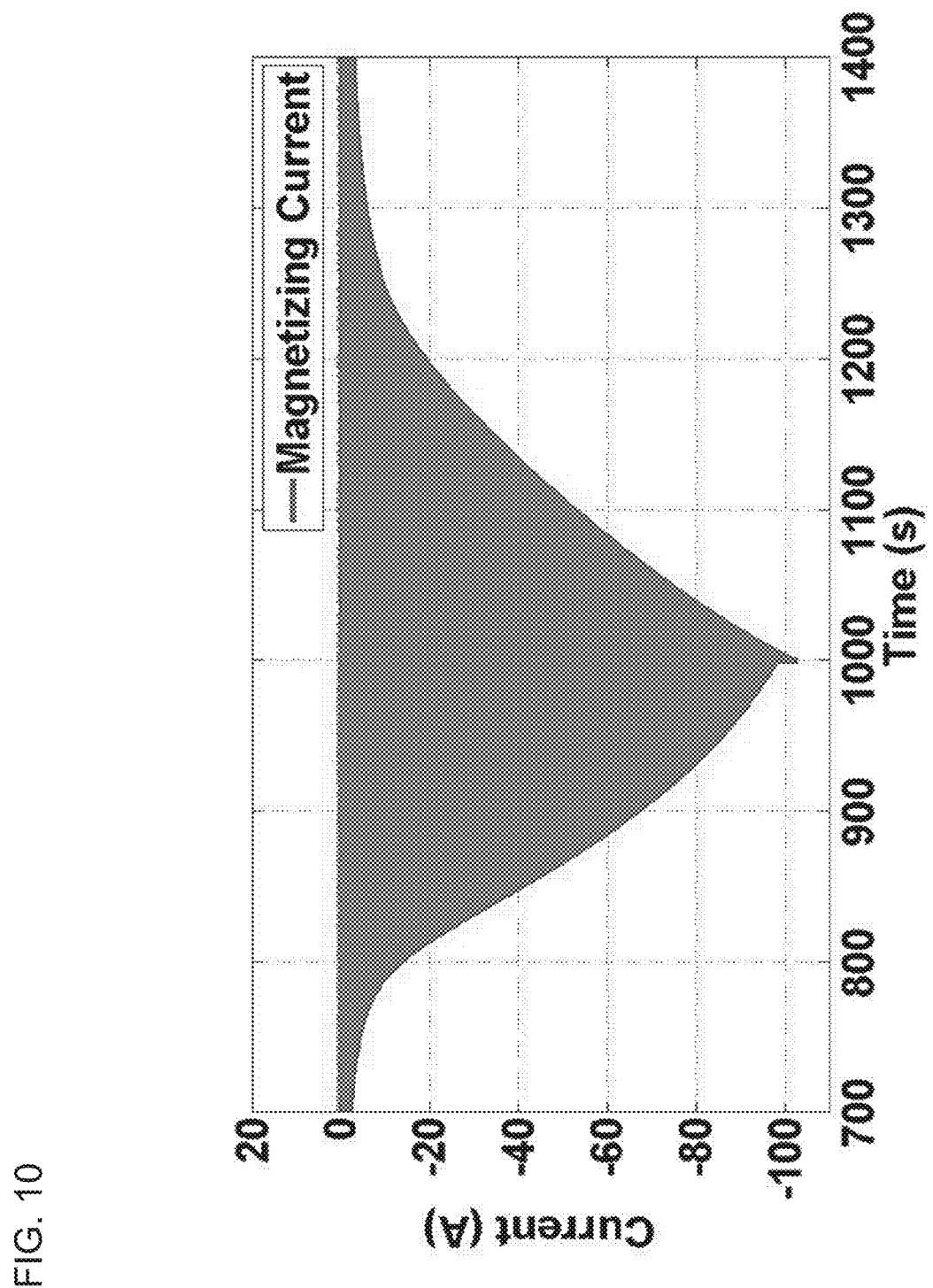
FIG. 10 is a plot showing the magnetizing current of Phase A of the transformer of FIG. 9.

FIG. 9 shows the magnetizing current from one of the branches of the transformer model ($L_{m3}$ in FIG. 9). In a real world application, the neutral windings would be closed sooner than it is done in the simulation but to show the effectiveness of the method, the ESP is allowed to be connected until the transformer goes deep into half-cycle saturation. Once in deep saturation, the neutral winding is switched on (at the $1,000^{th}$ seconds) with the ESP still connected. It can be observed that the mitigation starts immediately after the neutral winding is connected. In FIG. 10, it is observed that the rate of increase while the transformer is getting saturated (from 700 seconds to 1,000 seconds) and rate of reduction during the mitigation with neutral connected (from 1,000 seconds to 1,300 seconds) are very close.

Short Circuit Performance

Short circuit simulations are conducted on the system to test the performance of the transformer assemblies described herein under various faults. Neutral current of the Dorsey transformer is compared in each case with and without the neutral winding for system normal (no fault), single-line-to-ground (SLG) fault, double-line-to-ground (DLG) fault, three-phase to ground (3LG) fault, and line-to-line (LL) fault with the remote end closed. To test the short circuit performance of the design with minimal variable, a close-in fault is applied since it has minimal ground and arc-resistance. The fault location is chosen to be a close-in fault on Dorsey to Forbes line at Dorsey sub-station.

Figure 11:
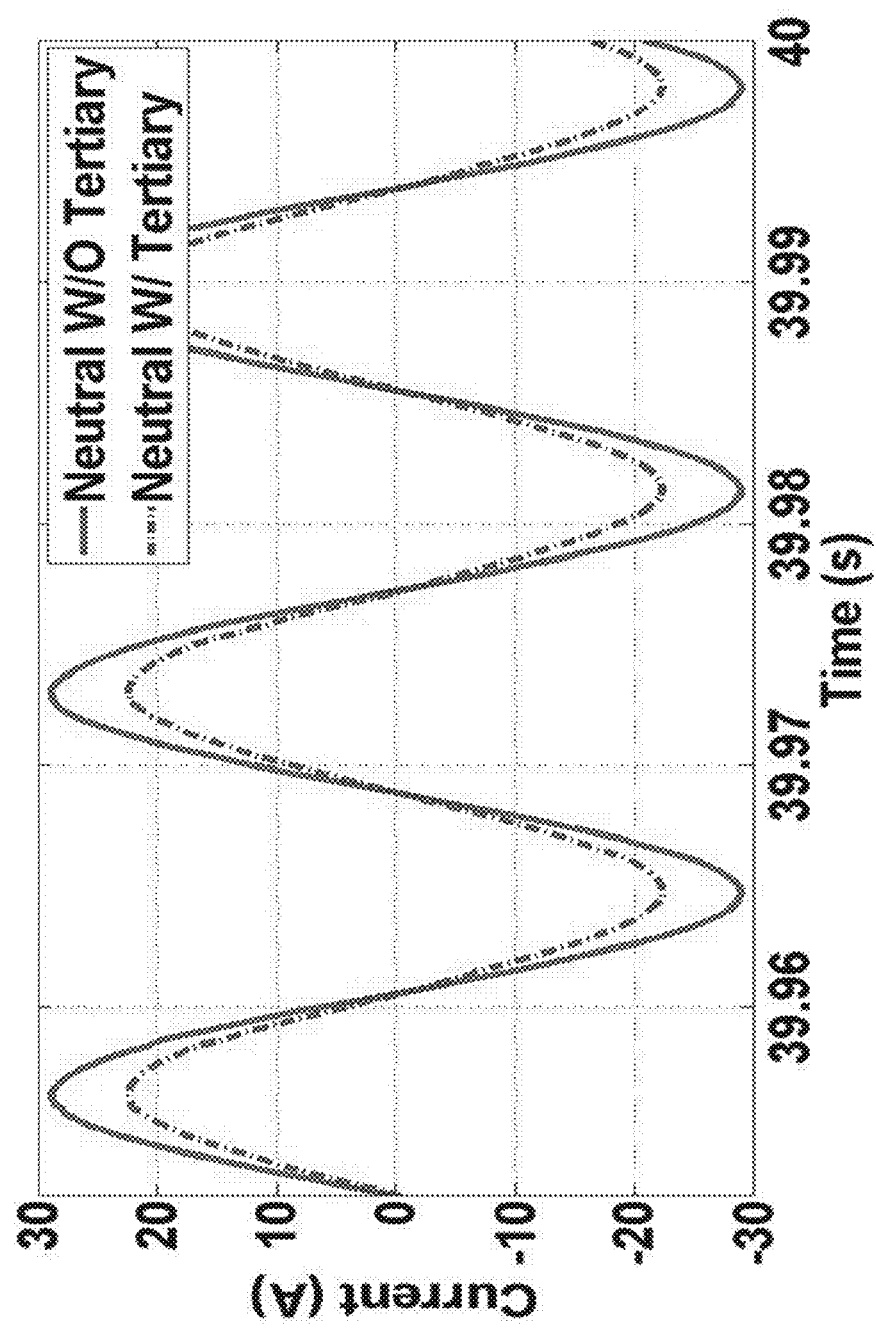
FIG. 11 is a current vs time plot of the Dorsey 500 kV neutral current with system normal.
Figure 12:
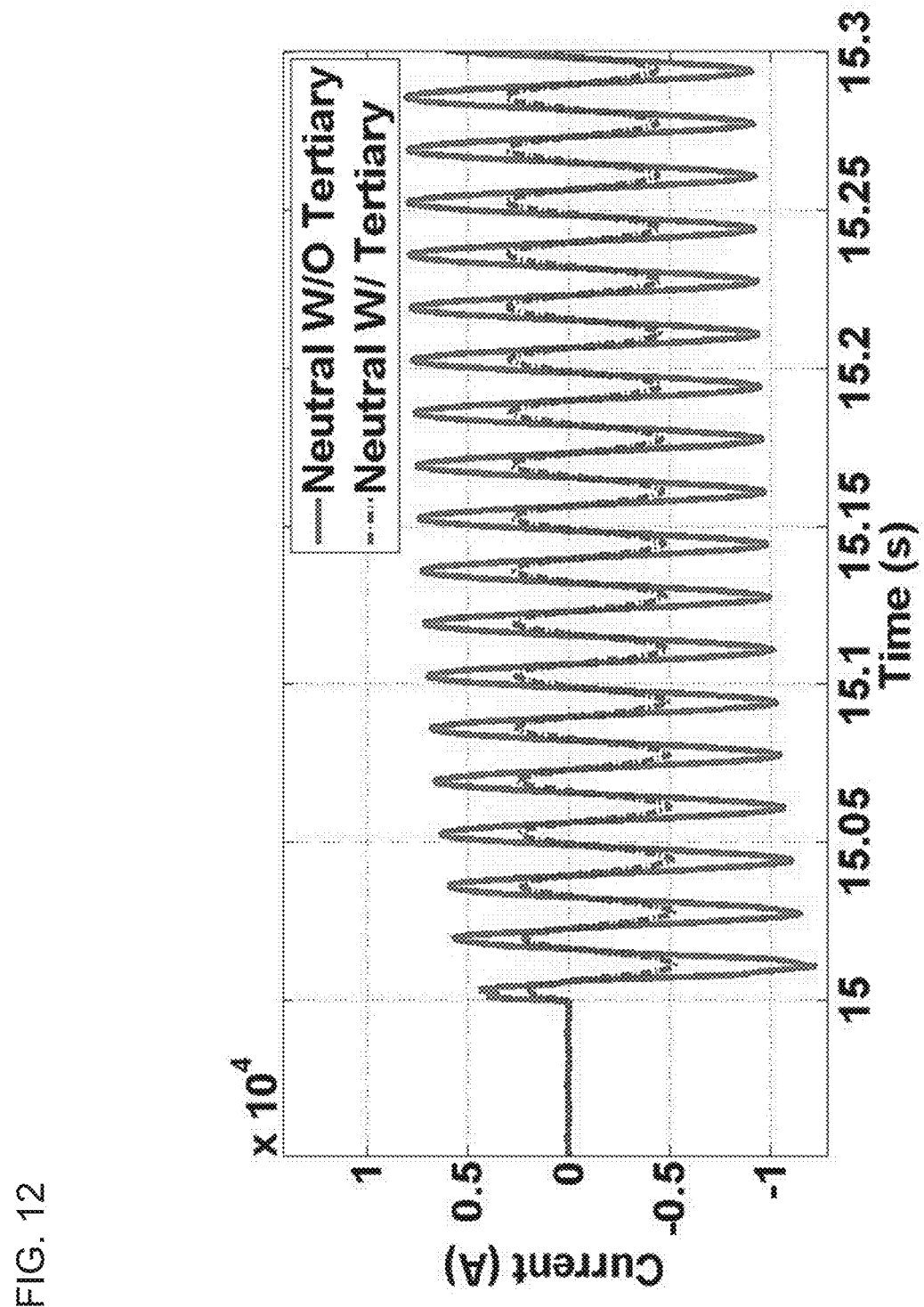
FIG. 12 is a current vs time plot of the Dorsey 500 kV neutral current with SLG fault.
Figure 13:
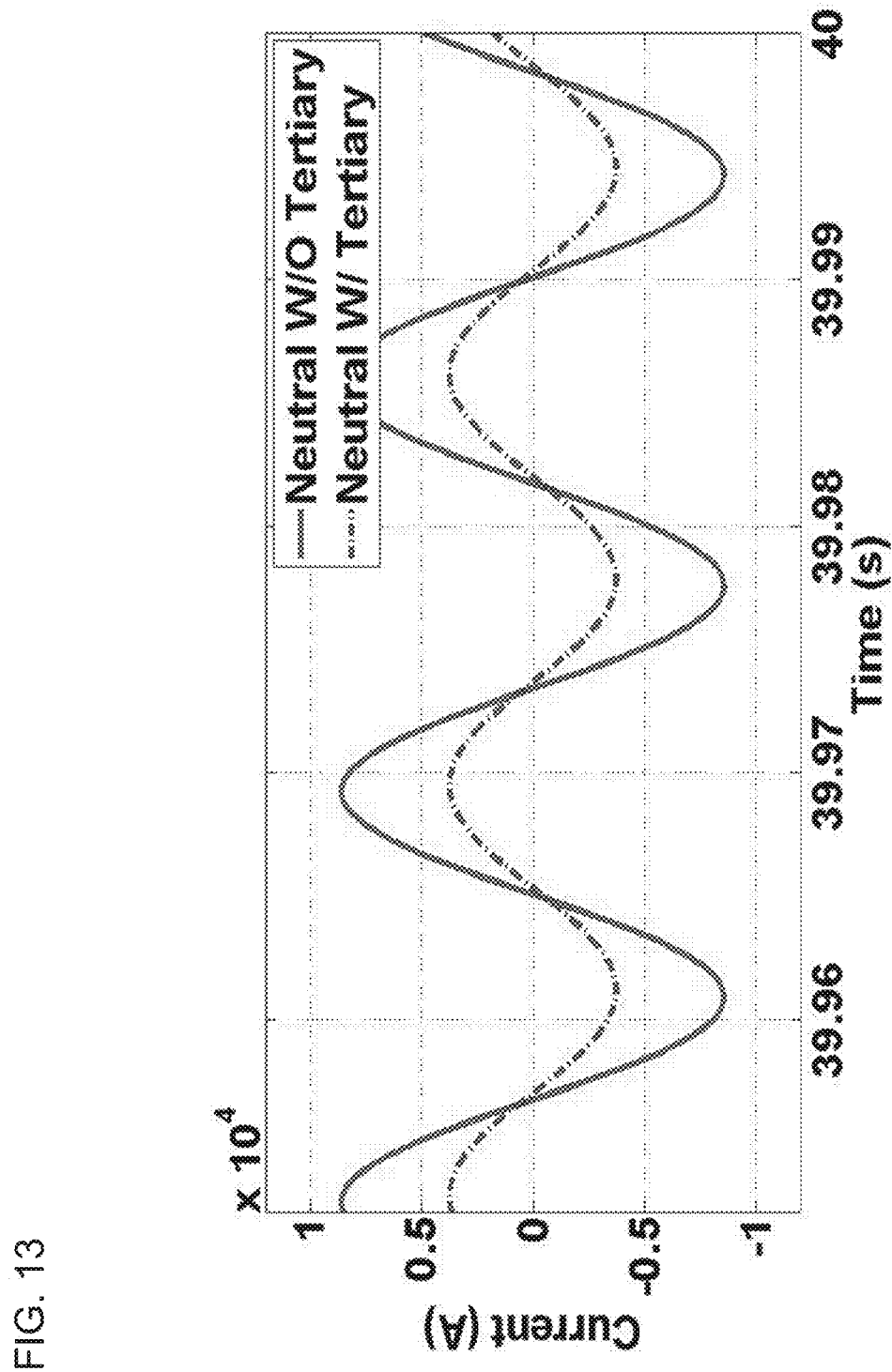
FIG. 13 is an enlarged view of a portion the current vs time plot of FIG. 12.

Under system normal conditions, minor reduction is observed as shown in FIG. 11. Note that although the loads are balanced in this system, the transmission lines are not transposed and one can observe a relatively small neutral current. Since zero sequence currents are additive in the neutral of a wye connected transformer similar to GIC, reduction in the fault level is observed for SLG and DLG faults. FIGS. 12 and 13 show the neutral current at Dorsey station for a SLG close-in fault. As observed in FIG. 11, the fault level is reduced starting immediately with the first peak. FIG. 13 shows the same fault at steady state with the fault still present to demonstrate the amount of reduction.

Figure 14:
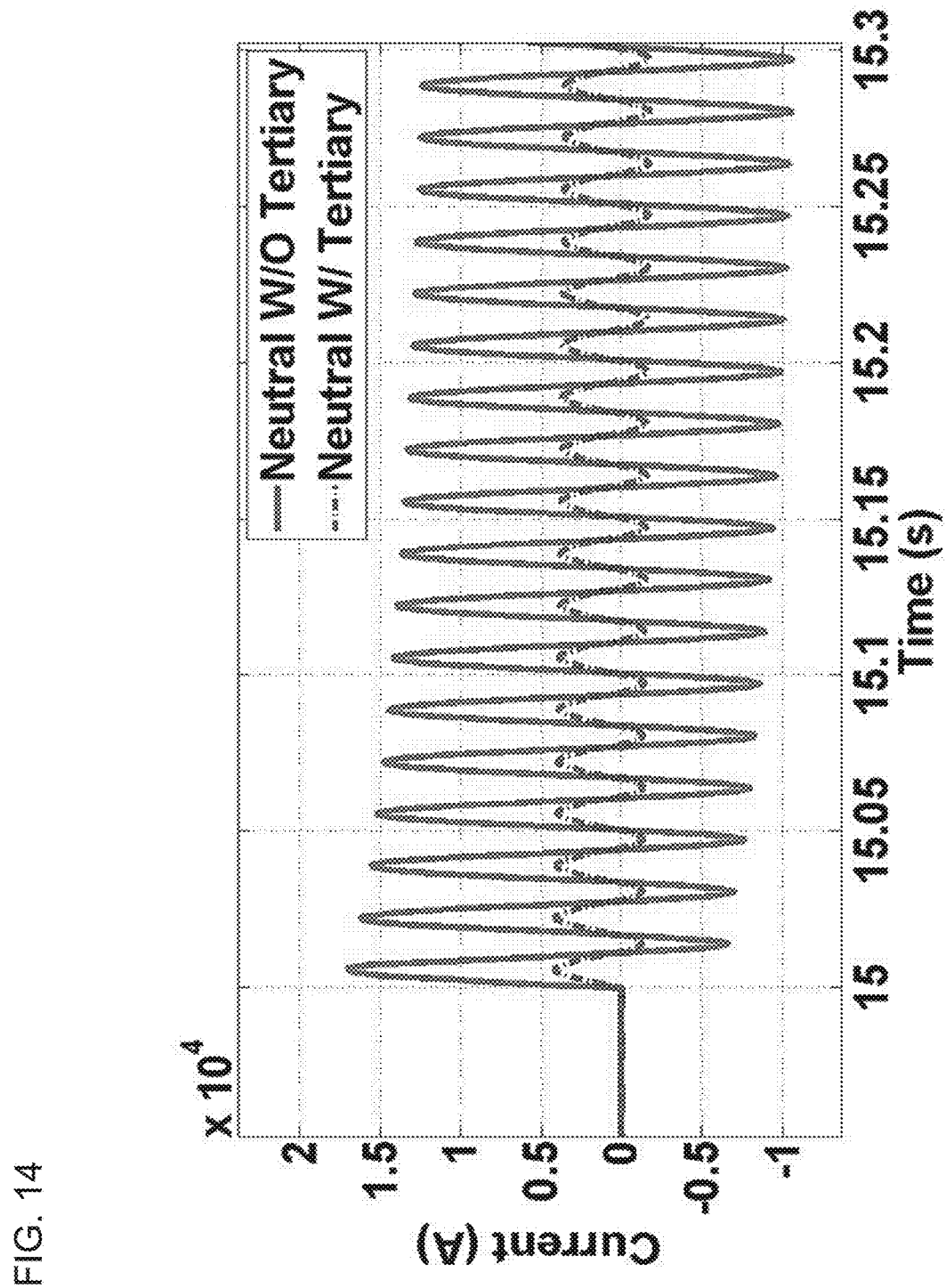
FIG. 14 is a current vs time plot of the Dorsey 500 kV neutral current with DLG fault.
Figure 15:
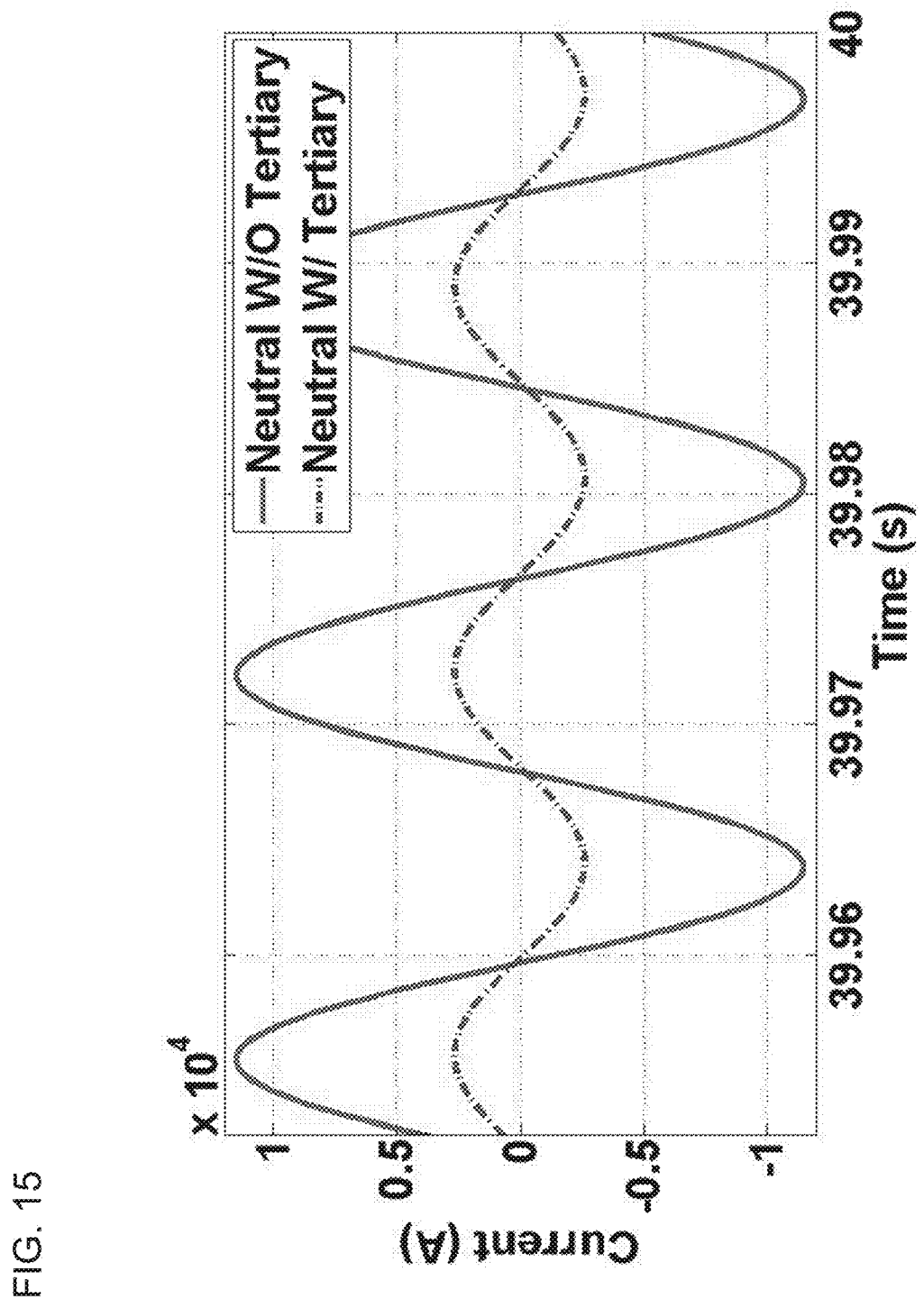
FIG. 15 is an enlarged view of a portion of the current vs time plot of FIG. 14.
Figure 16:
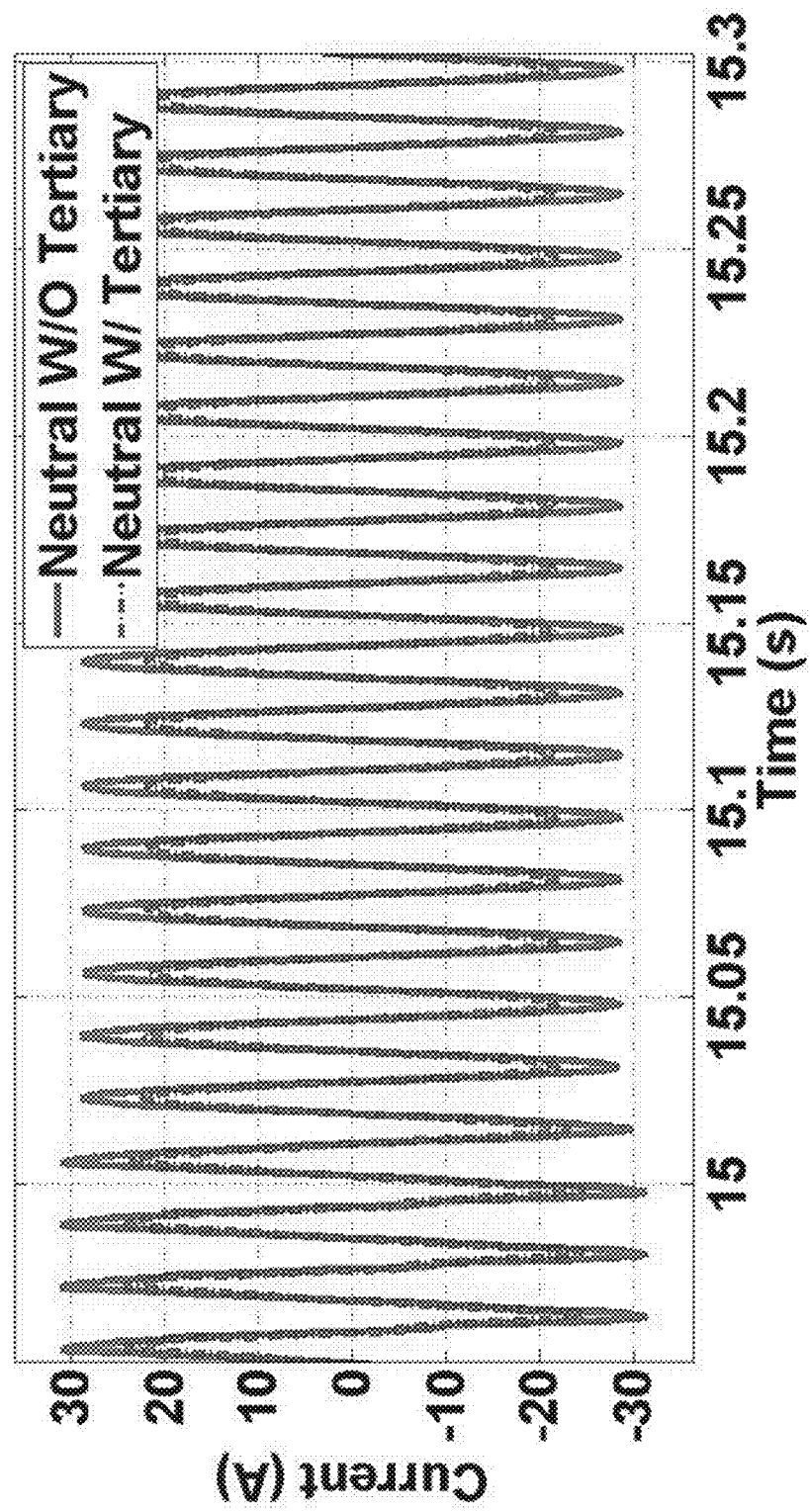
FIG. 16 is a current vs time plot of the Dorsey 500 kV neutral current with LL fault.
Figure 17:
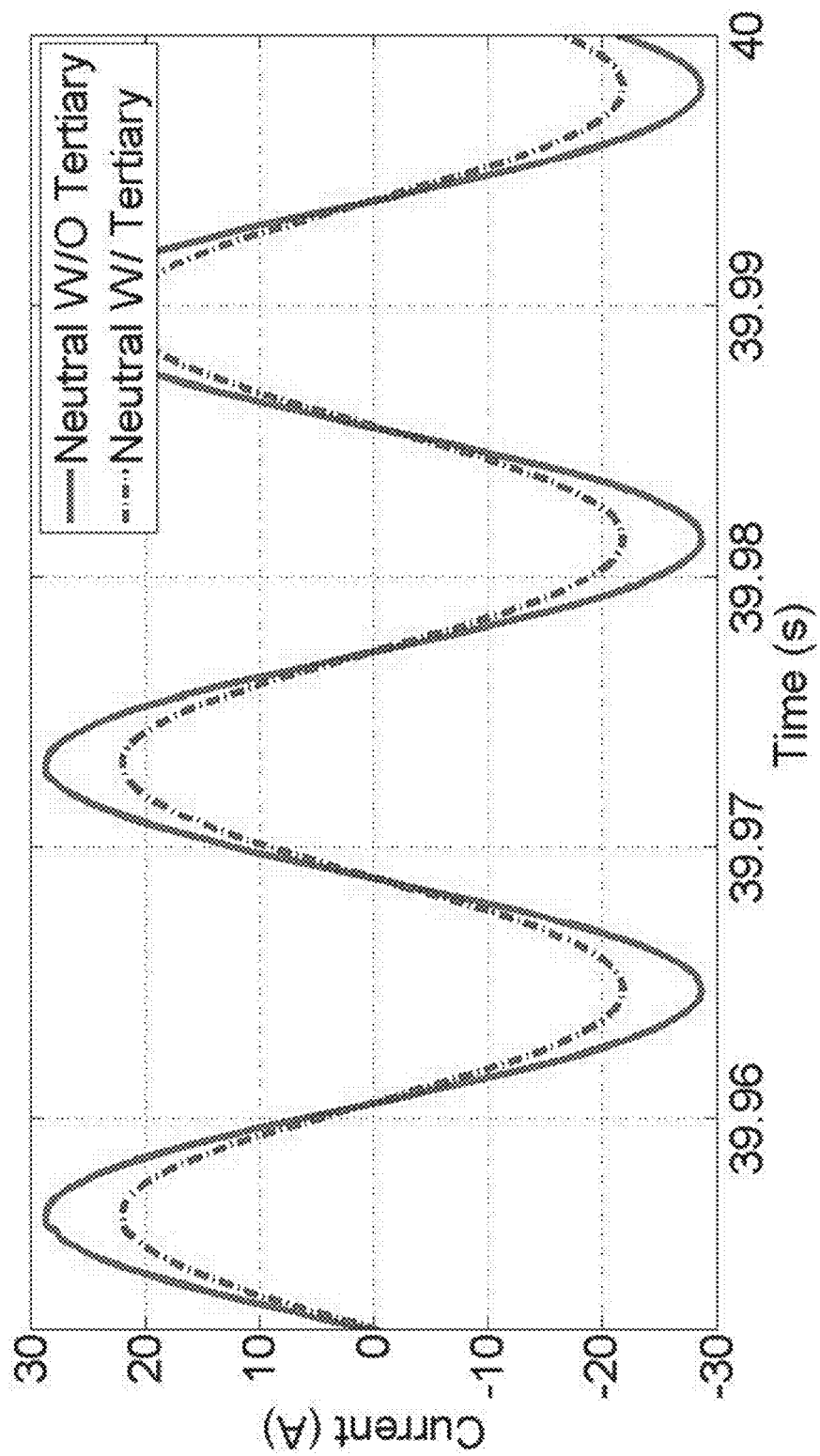
FIG. 17 is an enlarged view of a portion of the current vs time plot of FIG. 16.

FIGS. 14 and 15 show the neutral current at Dorsey station for a DLG fault. As seen in FIG. 14, a greater reduction is observed with DLG close in fault. FIG. 15 shows the same fault in steady state where the reduction is observed clearly. Three phase fault is not shown since a bolted 3LG fault is balanced and does not contain zero-sequence currents. Dorsey transformer neutral current is shown for a line-to-line close-in fault. As expected the neutral current is low since no zero-sequence current is present. Similar reduction to system normal is achieved as shown in FIG. 16 and FIG. 17.

While FIGS. 3 and 4 show the transformer 100 including a particular configuration of the primary windings 110, the secondary windings 120 and the neutral windings 130, in other embodiments, the windings may be arranged in any suitable configuration. In some embodiments, a transformer may include a core having at least one primary leg, at least one secondary leg positioned parallel to the at least one primary leg, and at least one yoke positioned orthogonal to each of the at least one primary leg and the at least one secondary leg. The primary winding may be positioned on a first portion of the core located on the at least one primary leg. The secondary winding may be positioned on a second portion of the core located on the at least one secondary leg. Furthermore, the neutral winding may be positioned on a third portion of the core located on the at least one yoke.

For example, FIG. 18A is schematic illustration of a transformer 200, according to an embodiment. The transformer 200 includes a core 202 that has a primary leg 203, a pair of secondary legs 205 positioned parallel to and on either side of the primary leg 20. A pair of yokes 207 are coupled to the ends of the primary leg 203 and the secondary legs 205 and positioned orthogonal thereto (e.g., at an angle of about 90 degrees as shown in FIG. 18A).

A primary winding 210 is positioned on the primary leg 203 and wound in a first rotational direction. A secondary winding 220 is positioned on each of the secondary legs 205 and wound in a second rotational direction opposite to the first rotational direction. A pair of neutral windings 230 are positioned on a first yoke 207 of the pair of yokes 207 on each portion of the corresponding yoke 207 positioned between each of the secondary legs 205 and the primary leg 203. Each of the secondary windings 220 and the neutral windings 230 may be coupled to a system ground (e.g., the system ground 160).

The secondary windings 220 may receive an ESP from the system ground which may cause an induced flux as shown in FIG. 18A. The neutral windings 230 are configured to produce a mitigating flux, as described before herein, so as to reduce or mitigate the induced flux. The direction of the mitigating flux of the transformer 200 of FIG. 18A is directed towards the secondary legs 205. FIG. 18B shows another transformer 300 according to an embodiment. The transformer 300 is the same as transformer 200 except that the neutral windings 230 are positioned on a second yoke 207 of the pair of yokes 207 positioned opposite the first yoke 207. In such embodiments, the mitigating flux (or otherwise current) produced by the neutral windings 220 is directed towards the primary leg 203.

While FIGS. 18A and 18B show the core 202 having three legs and two yokes, in other embodiments, a transformer can include any number of legs, for example 2, 3, 4, 5, or even more coupled together via yokes. The primary windings (e.g., the primary windings 210) and the secondary windings (e.g., the secondary windings 220) may be positioned in any suitable configuration on the core with the neutral windings (e.g., the neutral windings 230) positioned on one or more of the yokes, or any portion thereof.

Section II: Harmonic Mitigation in Power Transfer Systems

A concern in power transfer systems is harmonics. Harmonics are signals generated in the process of electrical conversion from ac to dc, dc to ac or ac from one frequency to another. Harmonics generated in this process are multiples of the fundamental power system frequency (60 Hz) such as 120 Hz (2nd harmonic), 180 Hz (3rd harmonic), etc. Among these, harmonics that have a frequency multiple of three are called triplen harmonics. Triplen harmonics are more common in buildings (due to fluorescent, power supplies, etc.) while other harmonics such as 5th, 7th, 11th, and 13th may be more problematic in industrial applications using Variable Frequency Drives (VFD) for motor speed control. Harmonics may cause a number of problems such as hindering the power factor, overheating the transformer, overloading the neutral cable, equipment failure, inefficient operation of motors, false trips (loss of revenue), non-compliance with standards (associated fines), and flickering in parallel connected circuits. It is estimated that 70% of distribution loads involve electronics that generate some form of harmonics. As per IEEE Std. 519, the total harmonic distortion has to be limited to 5% of the fundamental current at point of interconnection.

Figure 19A:
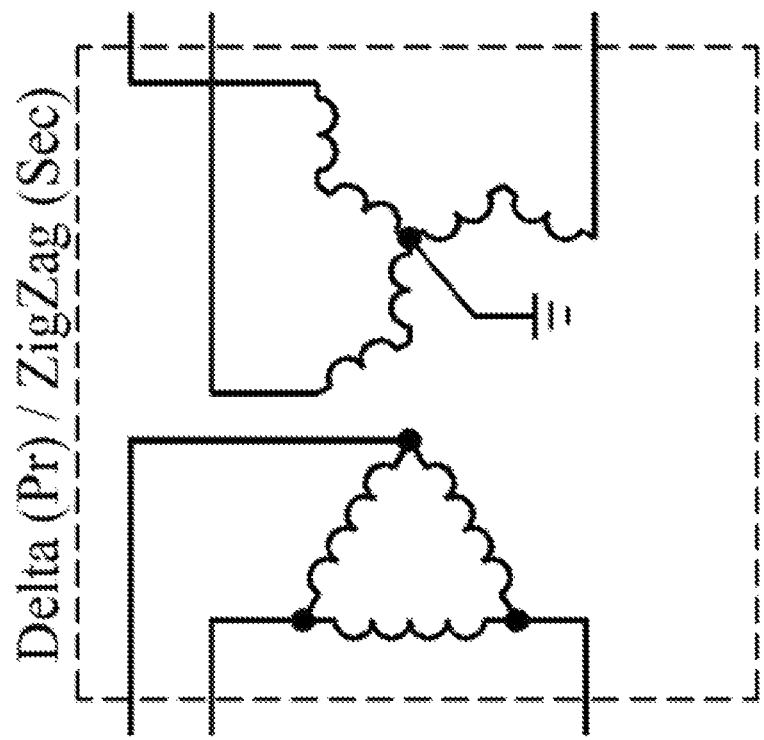
FIG. 19A is simplified circuit diagram of a transformer having primary and neutral windings arranged in a delta/star configuration and FIG. 19B is a circuit diagram of a transformer having primary and neutral windings arranged in a delta/zig-zag configuration.
Figure 19B:
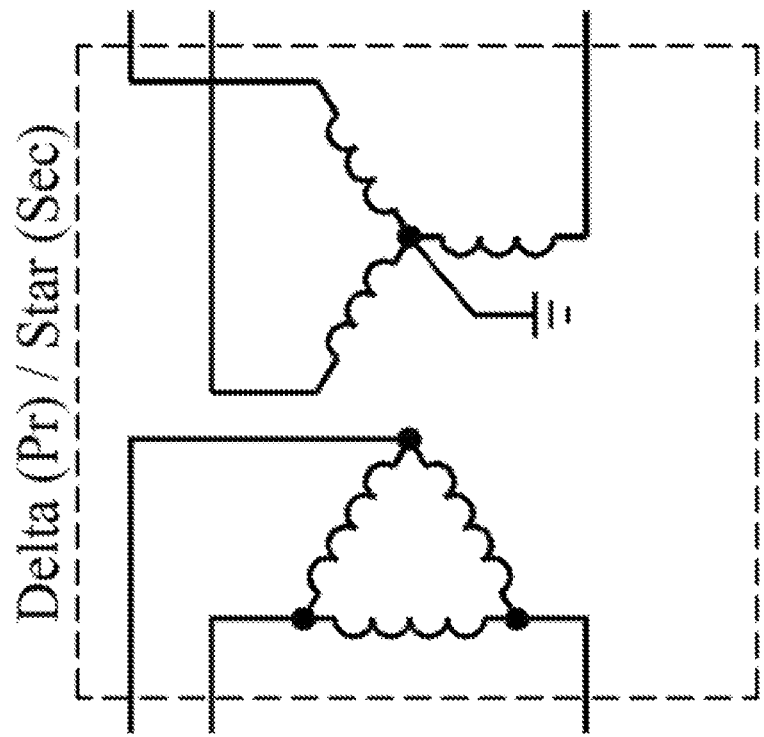

Mitigating harmonics is desirable so as to reduce their adverse effects, to save energy, and/or to gain incentives from utilities for the reduced energy consumption. Various techniques may be employed for mitigating harmonics such as passive filters, active filters, zig-zag transformer designs to mitigate triplen harmonics and phase-shifting transformers to mitigate non-triplen harmonics. Generally, one approach which may be used for mitigating harmonics includes designing the distribution transformer secondary windings such that the primary windings are not coupled to the triplen harmonics in the secondary windings. For example, FIG. 19A is a simplified circuit diagram of a delta/star transformer configuration that includes the primary windings positioned in a delta configuration (Delta (Pr)) and the secondary windings positioned in a star configuration (Star (Sec)). FIG. 19B is a simplified circuit diagram of another transformer that includes the primary and secondary windings positioned in a delta/zig-zag configuration.

The delta/star transformers trap the triplen harmonics in the delta configuration and prevent it from flowing upstream. However, the triplen harmonics are still coupled to the primary and exist both in primary and secondary. Therefore, it may cause overheating and voltage distortion. On the other hand, delta/zig-zag transformers may decouple triplen harmonics from the primary winding, and may be used in phase shifting applications to further mitigate harmonics other than triplen harmonics. However, triplen harmonics may still exist between secondary windings and an electric load coupled to the transformer. Furthermore, use of a delta/star or delta/zig-zag transformer may require replacement of the distribution transformer, if the existing transformer does not employ delta configuration.

Systems and methods described herein include power transfer systems comprising an electric source and an electric load. A step down transformer electrically couples the electric source to the electric load via electric lines. The step down transformer is configured to reduce a first voltage provided by the electric source to a second voltage compatible with an operational voltage of the electric load. The power transfer system also includes a filter transformer comprising a core. At least one primary winding is positioned on a first portion of the core. The at least one primary winding is electrically coupled to the electric lines between the step down transformer and the electric load. At least one neutral winding on a second portion of the core. The second portion may be the same as the first portion or different therefrom. The at least one neutral winding is electrically coupled to a system ground. The filter transformer may be configured to provide a low impedance path so as to allow harmonics to circulate between the filter transformer and the load instead of flowing into the step down transformer.

Figure 20:
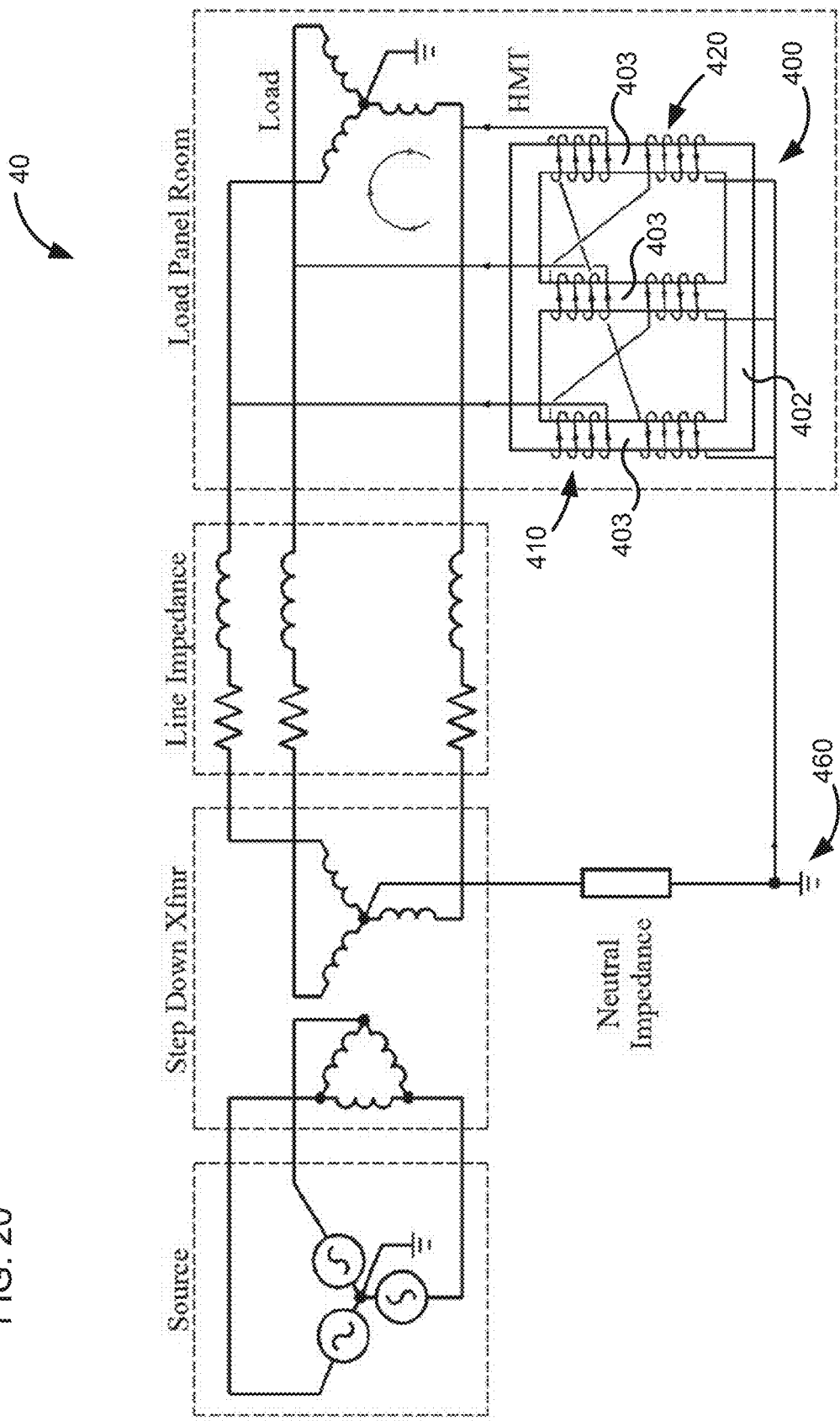
FIG. 20 is a simplified circuit diagram of a power transfer system including a filter transformer which includes primary and neutral windings arranged in a zig-zag configuration.

For example, FIG. 20 shows a simplified circuit diagram of power transfer system 40 according to an embodiment. The power transfer system 40 includes a three phase voltage source, a step down transformer and electric lines coupling the step down transformer to an electric load or load. A filter transformer, arranged in zig-zag configuration, 400 is coupled to the electric lines between the step down transformer and the load so as to be positioned parallel thereto.

The filter transformer 400 may include a core 402 having a plurality of legs 403 positioned parallel to each other. A primary winding 410 and a neutral winding 420 may be positioned on each of the plurality of legs 403. FIG. 20 shows the core 402 including three legs 403. In other configurations, the core 402 may include any number of legs so that the primary winding 410 and the neutral winding 420 may be positioned on each of the plurality of legs 403.

As shown in FIG. 20, the primary windings 410 and the neutral windings 420 are positioned in a zig-zag configuration. The primary windings 410 are coupled to the electric lines between the step down transformer and the load. The s neutral windings are coupled to the system ground 460. A neutral phase of the step down transformer may also be coupled to the system ground 460 via a neutral impedance.

The filter transformer 400 is configured to provide a low impedance path for triplen harmonics to flow therethrough. The triplen harmonics may circle back through the filter transformer 400 instead of flowing into the step down transformer (also referred to herein as the "distribution transformer"). In this manner, the filter transformer 400 may mitigate triplen harmonics. The filter transformer 400 may be added on to an existing power transfer system close to the electric load without having to significantly modify the power transfer system. The filter transformer 400 may prevent the triplen harmonics from flowing into the distribution transformer such that triplen harmonics are mitigated between the distribution transformer secondary windings and the electric load.

Figure 21:
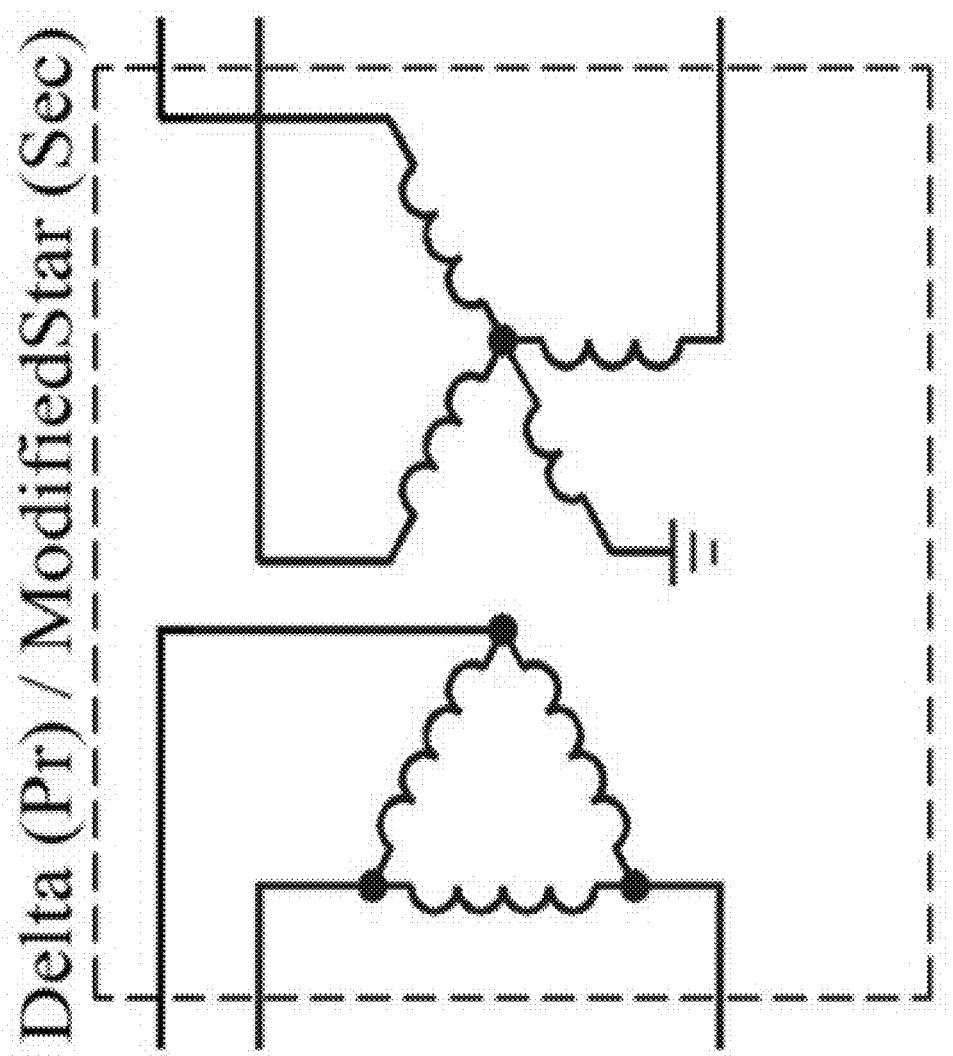
FIG. 21 is a simplified circuit diagram of a filter transformer which includes primary and neutral windings arranged in a delta/modified star configuration.

FIG. 21 is a simplified circuit diagram of a distribution transformer which includes the primary and secondary windings positioned in a delta/modified star configuration. In this configuration, a neutral phase or otherwise a neutral winding of the transformer is provided and coupled to a system ground. The modified star configuration can also be used as a filter type transformer (e.g., in the power transfer system 50 described below) where the primary windings are arranged in a star configuration and coupled with the neutral winding to ground.

Figure 22:
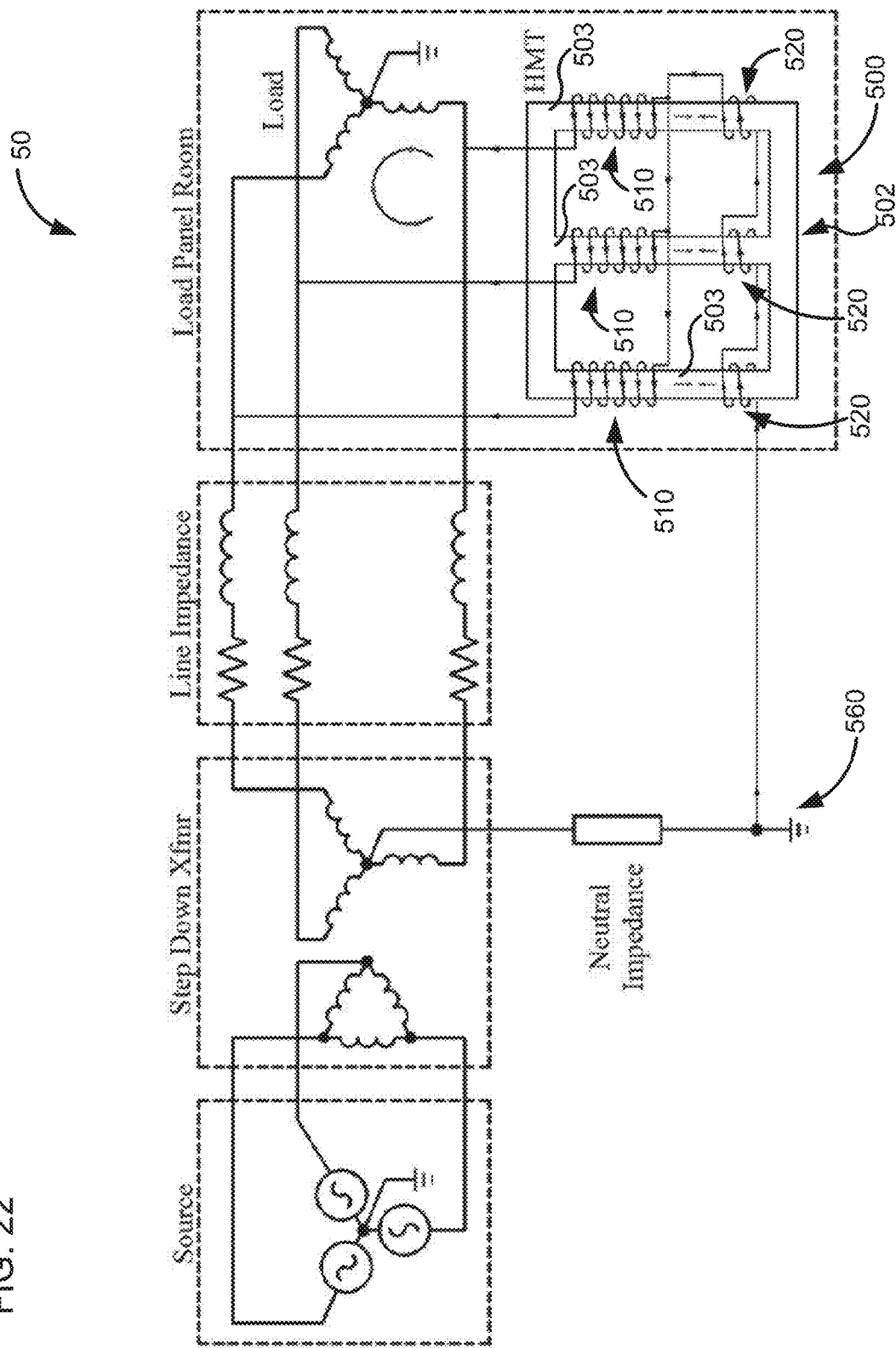
FIG. 22 is a simplified circuit diagram of a power transfer system that includes a filter transformer having a delta-modified star configuration.

FIG. 22 is a simplified circuit diagram of power transfer system 50 according to an embodiment. The power transfer system 50 includes a three phase voltage source, a step down transformer and electric lines coupling the step down transformer to an electric load or load. A filter transformer 500 is coupled to the electric lines between the step down transformer and the load so as to be positioned parallel thereto.

The filter transformer 500 may include a core 502 having a plurality of legs 503 positioned parallel to each other. A primary winding 510 and a neutral winding 520 may be positioned on each of the plurality of legs 503. FIG. 22 shows the core 502 including three legs 503. In other configurations, the core 502 may include any number of legs so that a primary winding 510 and a neutral winding 520 may be positioned on each of the plurality of legs 503. Each of the plurality of neutral windings 520 may be serially coupled to each other. Furthermore, each of the primary windings 510 may be coupled to each other such that the transformer 500 has modified star configuration.

The primary windings 510 are coupled to the electric lines between the step down transformer and the load. The neutral windings 520 are coupled to the system ground 560. A neutral phase of the step down distribution transformer (Xfmr 1) may also be coupled to the system ground 560 via a neutral impedance. The filter transformer 500 is configured to provide a low impedance path for triplen harmonics to flow therethrough. This causes the triplen harmonics circulate between the load and the "filter transformer" such that the step-down transformer is free of triplen harmonics.

Figure 23:
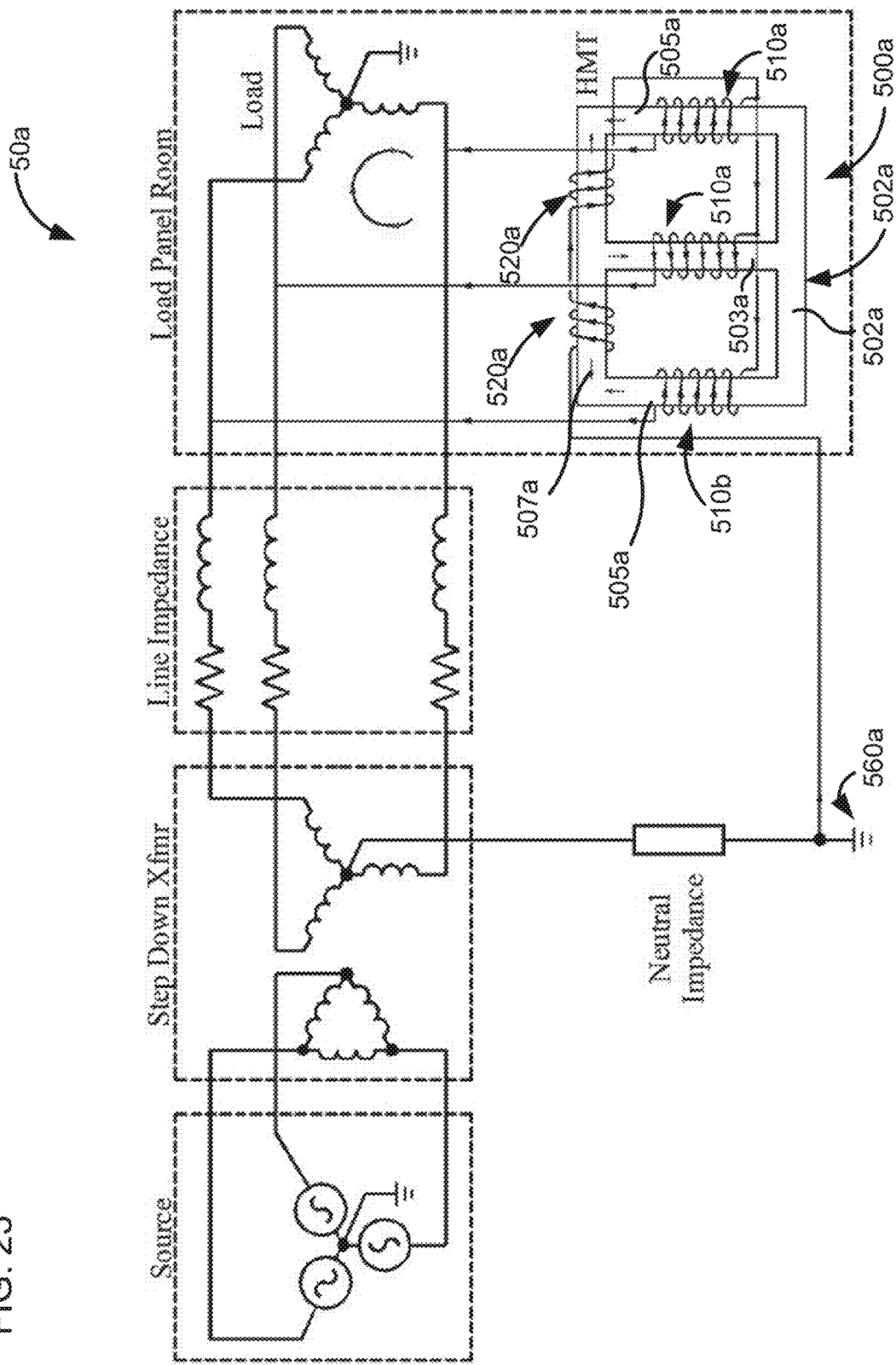
FIG. 23 is a simplified circuit diagram of a power transfer system that includes a filter transformer having a delta-modified star configuration and neutral windings positioned on a yoke of the filter transformer.

FIG. 23 is a simplified circuit diagram of power transfer system 50a according to an embodiment. The power transfer system 50a may include a three phase voltage source, a step down transformer and electric lines coupling the step down transformer to an electric load or load. A filter transformer 500a is coupled to the electric lines between the step down transformer and the load so as to be positioned parallel thereto.

The filter transformer 500a may include a core 502a having a middle leg 503a, a plurality of additional legs 505a positioned parallel to and on either side of the middle leg 503a. Furthermore, yokes 507a are positioned orthogonal to the middle leg 503a and the legs 503a/505a on either side of the additional legs 505a. A primary winding 510a may be positioned on the middle leg 503a. Other primary windings 510b may be positioned on each of the additional legs 505a. Furthermore, neutral windings 520a may be positioned on at least one of the yokes 507a on either side of the legs or a combination thereof. A direction of the primary winding 510a wound on the middle leg 503a is opposite to that of other primary windings 510b wound on the additional legs 505a. Furthermore, a direction of the neutral winding 520a on each section of the yokes 507a is also opposite to each other.

The primary winding 510a/b are coupled to the electric lines between the step down transformer and the load. The neutral windings 520a are coupled to a system ground 560a. A neutral phase of the step down distribution transformer may also be coupled to the system ground 560a via a neutral impedance. The filter transformer 500a is configured to provide a low impedance path for triplen harmonics to flow therethrough. This causes the triplen harmonics circulate between the load and the "filter transformer" such that the step-down transformer is free of triplen harmonics, while also allowing mitigation of induced flux as described herein. The filter transformer 500a may use less material and therefore may have a much lower cost relative to a zig-zag transformer.

Figure 24:
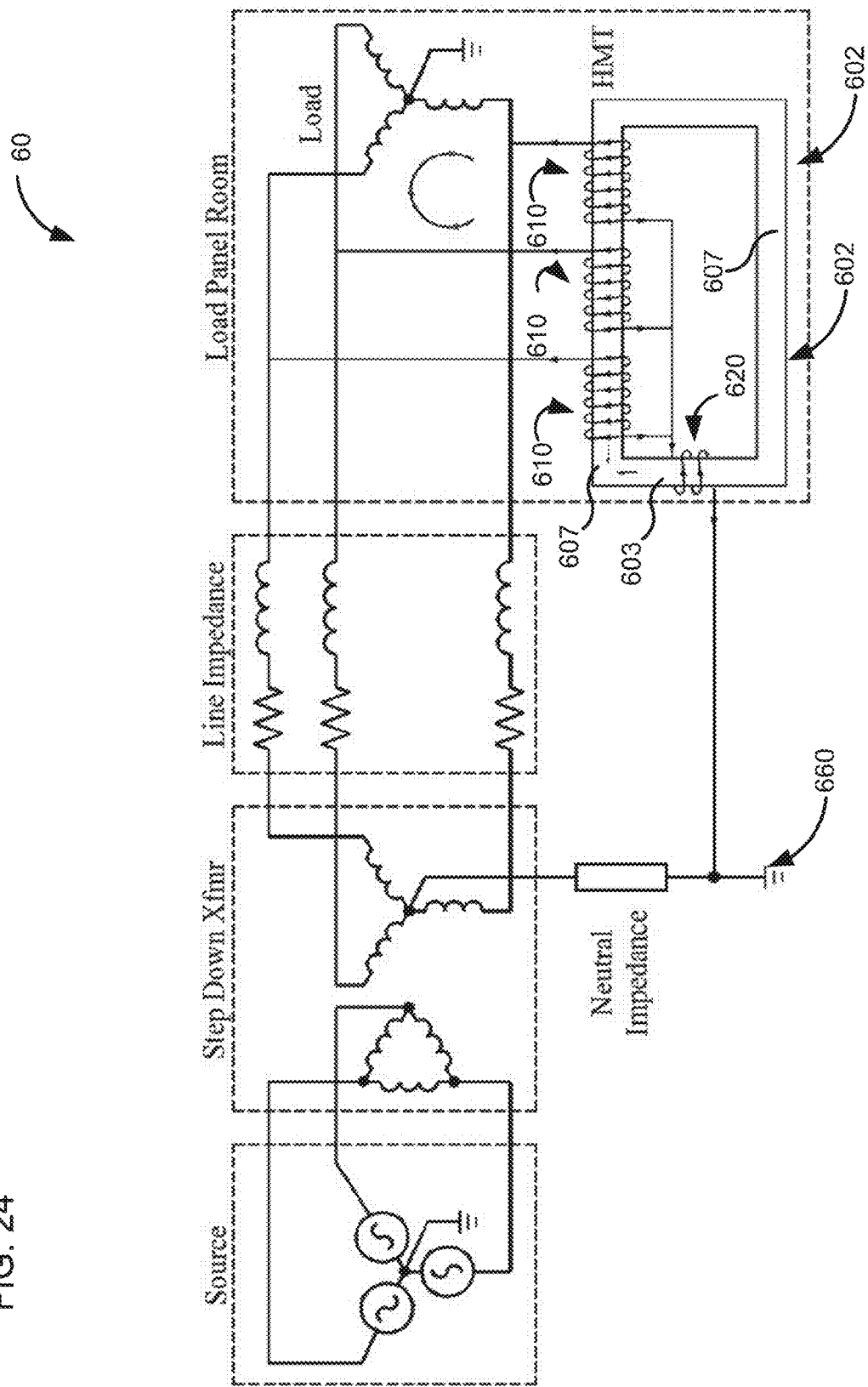
FIG. 24 is simplified circuit diagram of a power transfer system that includes a filter transformer having a delta-modified star and including a single core with the primary windings positioned on a yoke and a secondary winding positioned on a leg of the core.

In some embodiments, a filter transformer may include a single core having a pair of legs and a pair of yokes positioned orthogonal to the pair of legs at opposite ends of the pair of legs. At least one primary winding may be positioned on a yoke of the pair of yokes and at least one neutral winding may be positioned on a leg of the pair of legs, vice versa or a combination thereof. For example, FIG. 24 is a simplified circuit diagram of a power transfer system 60 according to an embodiment. The power transfer system 60 includes a three phase voltage source, a step down transformer and electric lines coupling the step down transformer to an electric load or load. A filter transformer 600 is coupled to the electric lines between the step down transformer and the load so as to be positioned parallel thereto.

The filter transformer 600 may include a single core 602 having a pair of legs 603 and a pair of yokes 607 positioned orthogonal to the pair of legs 603. In one embodiment, a plurality of primary windings 610 may be positioned on the yoke 607 and in parallel to each other. The primary windings 610 are coupled to the electric lines between the step down transformer and the load. One or more neutral windings 620 may be positioned on a leg 603 of the pair of legs 603. The neutral winding 620 is serially coupled to the plurality of primary windings 610 as well as a system ground 660. The filter transformer 600 is configured to provide a low impedance path for triplen harmonics to flow therethrough such that the triplen harmonics circulate between the load and the "filter transformer" so that the step-down transformer is free of triplen harmonics.

It should be appreciated that while FIGS. 20, 22, 23, 24 show particular filter transformers having a particular configuration of primary and neutral windings, these are merely illustrations of the concepts described in the disclosure. In various embodiments, filter transformers used for harmonic and/or GIC mitigation in power transformers having any suitable configuration may be used and should be considered to be within the scope of the disclosure. For example, the primary and neutral windings may be positioned on separate legs of a polygonal core, on the same leg of a polygonal core, positioned on a yoke of a polygonal core, positioned on a leg or yoke of a polygonal core, positioned at various locations on a U-shaped core, positioned at separate locations of a circular or toroidal core, positioned on top of each other, neutral windings positioned on top of a portion of the primary windings, varying distance between primary and neutral winding, neutral windings partially overlapping primary windings or any other suitable configuration or combination thereof.

In some embodiments, a core of a filter transformer may include a plurality of legs and the filter transformer may include a plurality of primary windings. Each of the plurality of primary windings may be wound on a first leg of the plurality of legs. The plurality of primary windings may be wound on top of each other so as to be concentric to each other. Furthermore, at least one neutral winding may be wound on the top of the plurality of primary windings so as to be concentric with the primary windings.

Figures 25A, 25B, 25C:
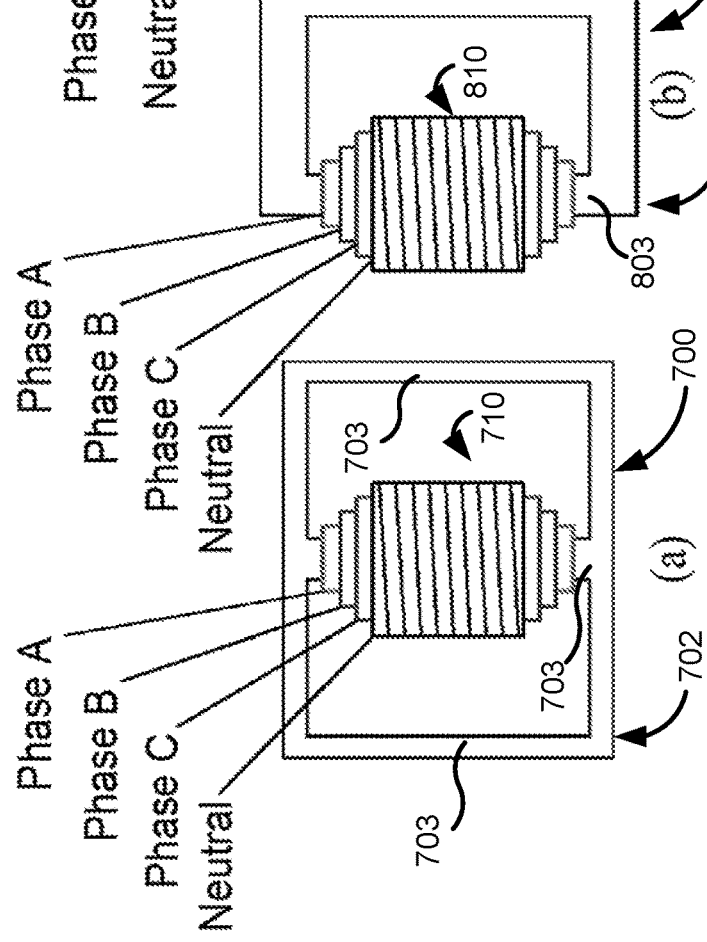
FIG. 25A, FIG. 25B and FIG. 25C are schematic illustrations of various delta-modified star transformers having the various windings thereof wrapped in shell-like configuration about one or more legs of the transformers.

For example, FIG. 25A is a schematic illustration of a filter transformer 700 that includes a core 702 having three legs 703. In some embodiments, the core 702 may have any number of legs (e.g., 2, 3, 4, 5 or even more). A primary winding corresponding to a first phase (phase A) is wound around a center leg 703 of the three legs 703 concentrically. A second primary winding (phase B) and a third primary winding (phase C) is wound concentrically about the phase A winding so as to be wound on top of each other. A neutral winding corresponding to a neutral phase is finally wound on top of the phase C winding so as to be concentric with the primary windings.

FIG. 25B is a schematic illustration of a filter transformer 800 according to another embodiment. The filter transformer 800 includes a core 802 having a pair of legs 803 positioned parallel to each other. The primary windings (phase A, B and C) and the neutral winding (neutral phase) are wound on one of the pair of legs as described with respect to FIG. 25A.

FIG. 25C shows still another embodiment of a filter transformer 900 which includes a core 902 including a pair of legs 903. A first portion of the plurality of primary windings including phases A and B is wound on a first leg 903a of the plurality of legs 903 on top of each other so as to be concentric to each other. A second portion of the plurality of primary windings including Phase C is wound on a second leg 903b of the plurality of legs. A neutral winding or neutral phase is wound on the top of the second portion of the plurality of primary windings, i.e. phase C so as to be concentric with the second portion of the plurality of primary windings and positioned on the second leg 903b.

Figure 26A:
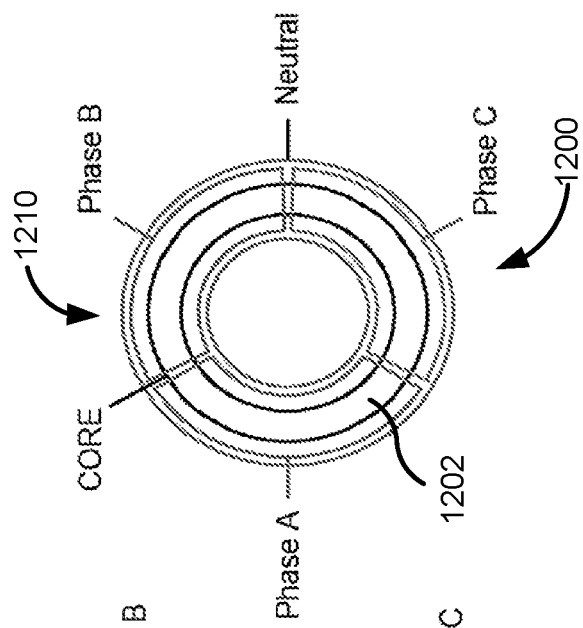
FIG. 26A, FIG. 26B and FIG. 26C are schematic illustrations of various delta-modified star transformers having the various windings thereof positioned around or about a circular core of the transformers.

In some embodiments, a filter transformer may include a circular core or have a toroidal shape. For example, FIG. 26A shows an embodiment of a filter transformer 1000 including a circular core 1002. A plurality of primary windings including phase A, B and C may be wound on top of each other about a circumference of the circular core 1002 so as to be concentric to the circular core 1002 and to each other. Furthermore, at least one neutral winding corresponding to a neutral phase may be wound around the plurality of primary windings so as to be concentric to the primary windings and the circular core 1002.

Figure 26B:
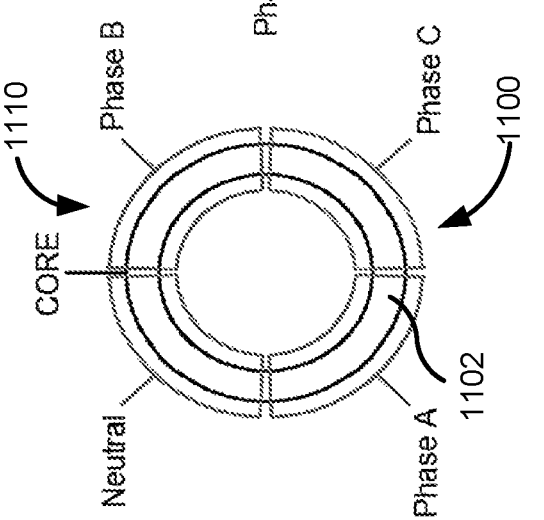
Figure 26C:
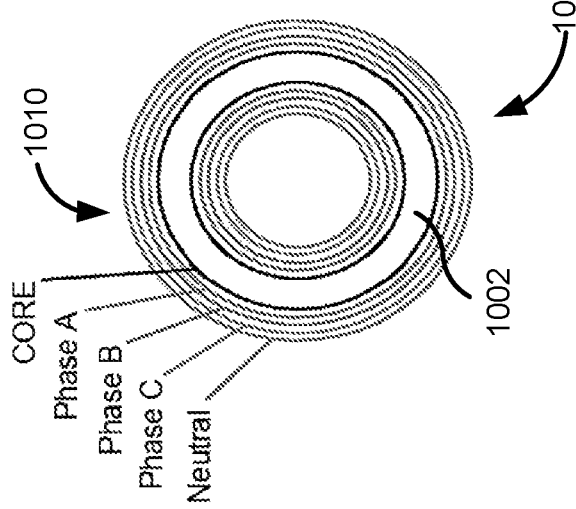

FIG. 26B shows another embodiment filter transformer 1100 including a circular core 1102. A plurality of primary windings including phase A, B and C and a secondary winding corresponding to a neural phase are wound about the circular core 1102 at different locations thereof. FIG. 26C shows another embodiment of a filter transformer 1200 that includes a circular core 1202. Primary windings including phase A, B and C are wound on different portions of the circular core 1202. A secondary winding including a neutral phase is wound around the primary windings about a circumference of the circular core 1202 so as to be concentric with the circular core 1202 but not the primary windings. The circular core filter transformers 1000/1100/1200 may be cost effective and/or relatively compact so as to allow structural clearances therefore facilitating installation.

Figure 27:
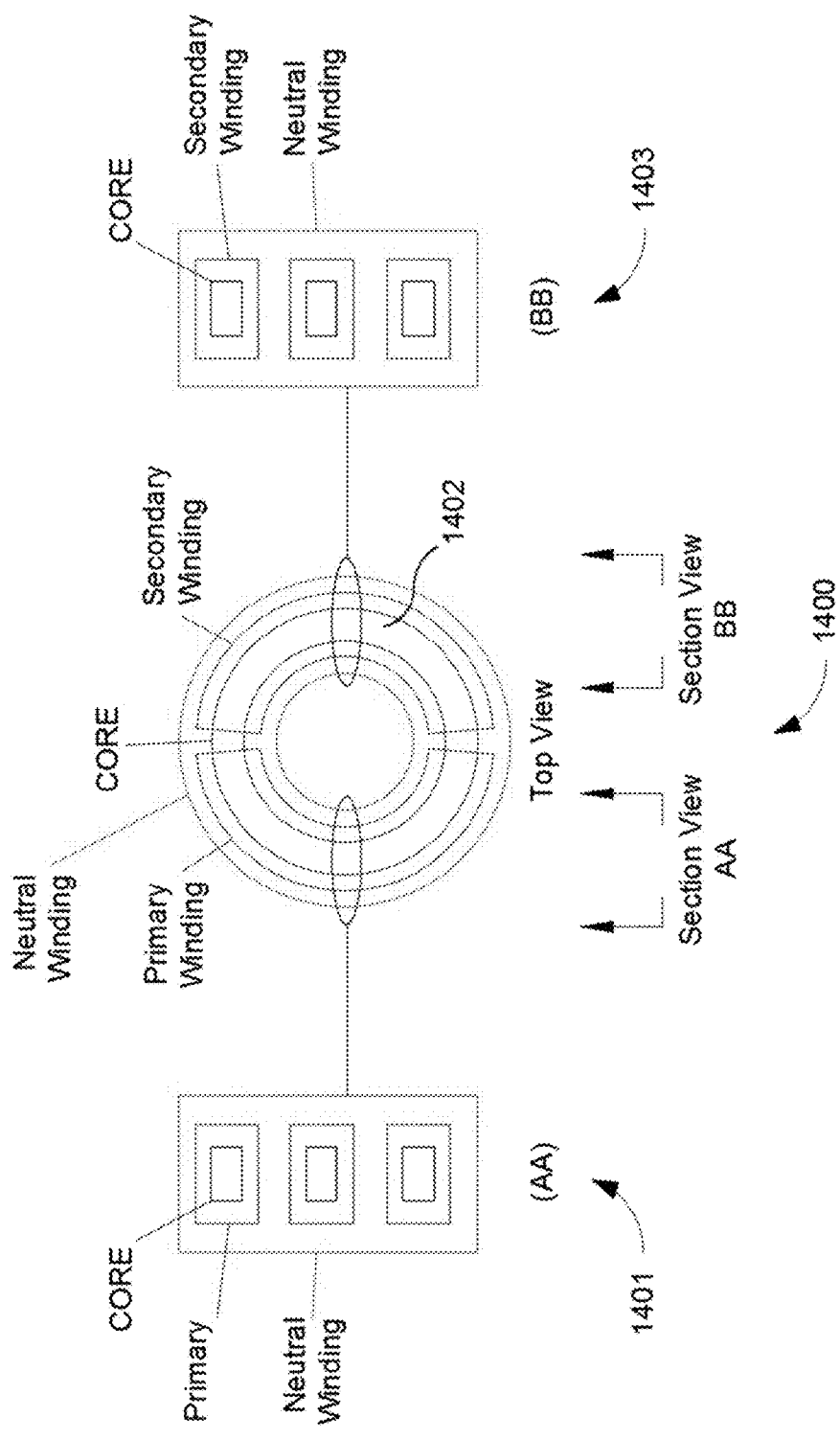
FIG. 27 shows an embodiment of a filter transformer including three circular cores and stacked up on top of each other.

In some embodiments, a filter transformer may include three circular cores stacked up on top of each other. For example, FIG. 27 shows an embodiment of a filter transformer 1400 including three circular cores 1401 and 1403 stacked up on top of each other. A plurality of primary windings including primary, secondary and neutral may be wound on top of each other about a circumference of the circular core 1400 so as to be concentric to the circular core 1402 and to each other. The winding may be wound in any section of the core similar to FIG. 26A thru 26C.

Figure 28:
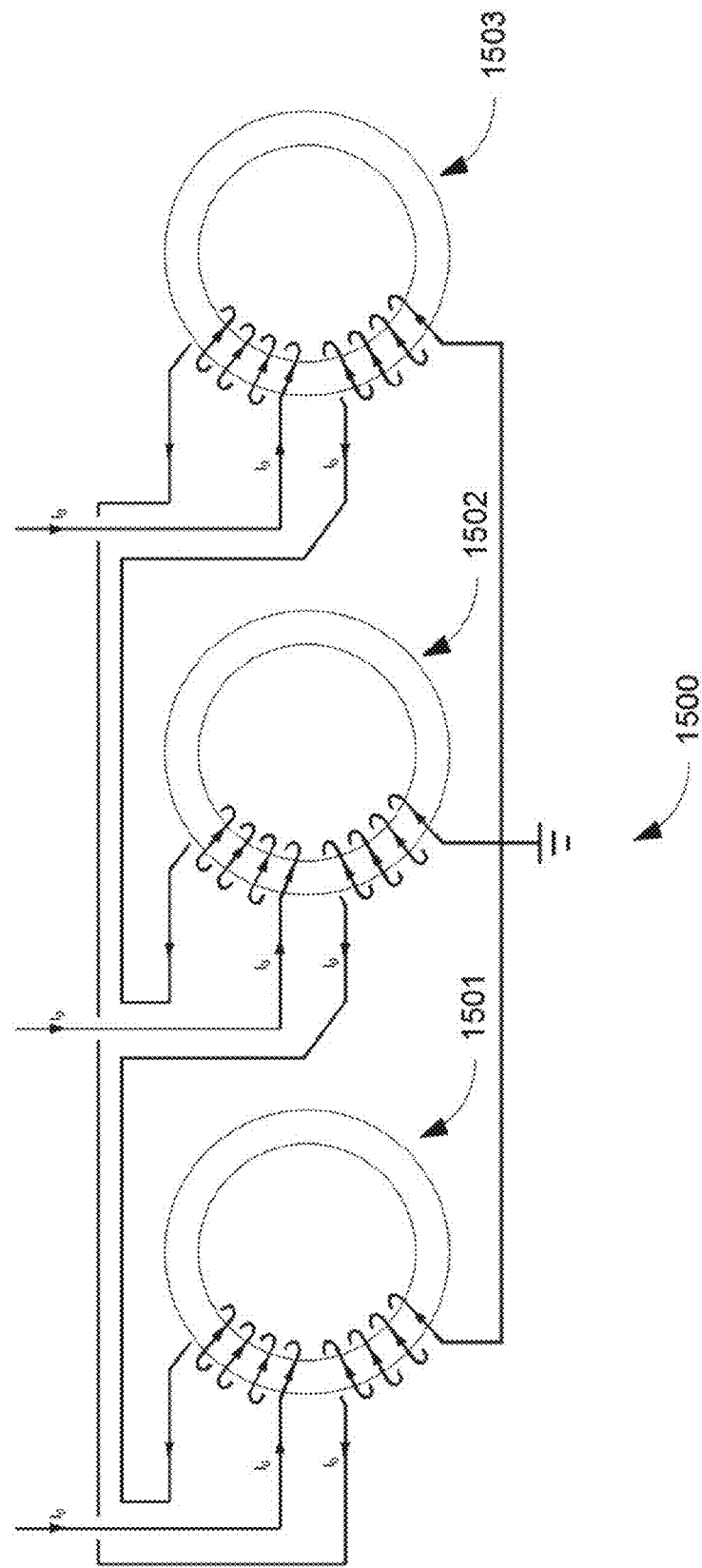
FIG. 28 shows an embodiment of a filter transformer including three circular cores and the zig-zag winding connection arrangements.

In some embodiments, a filter transformer may include three circular cores stacked up on top of each other in zig-zag. For example, FIG. 28 shows an embodiment of a filter transformer 1500 including three circular cores 1501, 1502 and 1503 and the zig-zag winding connection arrangements. A plurality of primary windings including two winding per core may be wound on top of each other about a circumference of the circular core 1501, 1502 and 1503 so as to be concentric to the circular cores and to each other. The windings may be wound in any section of the core similar to FIG. 26A thru FIG. 26C. Each single phase transformer may be stacked up similar to FIG. 27.

Figure 29B:
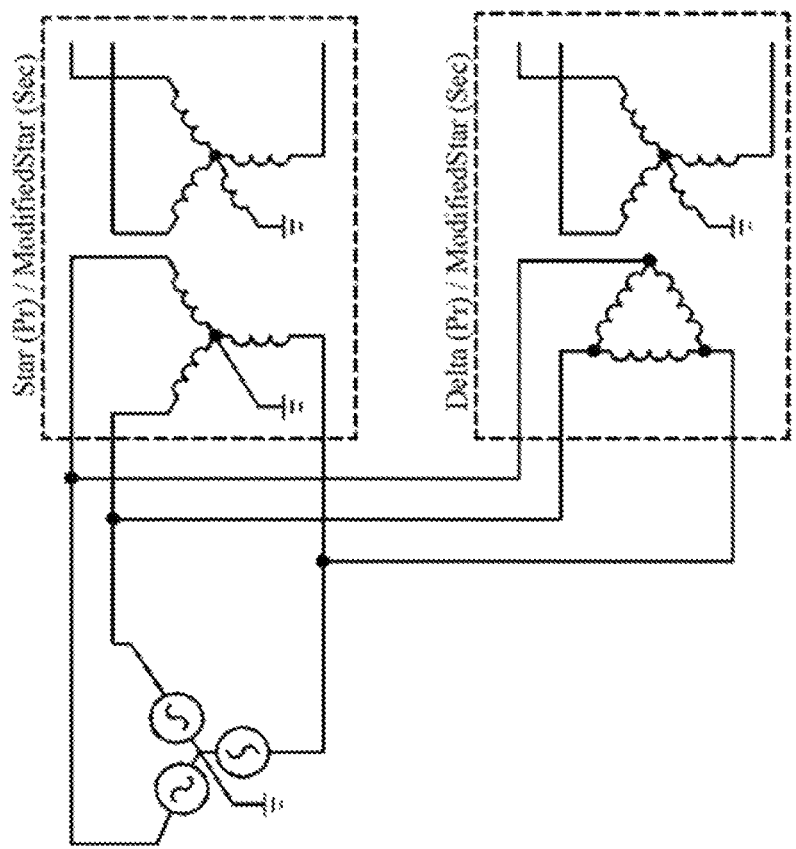
FIG. 29A and FIG. 29B show simplified circuit diagrams of two configurations of a three phase system including phase-shifting using a transformer having a delta/star configuration (a) and another transformer having a delta/modified star configuration so as to mitigate triplen, $5^{th}$ and $7^{th}$ harmonics.
Figure 29A:
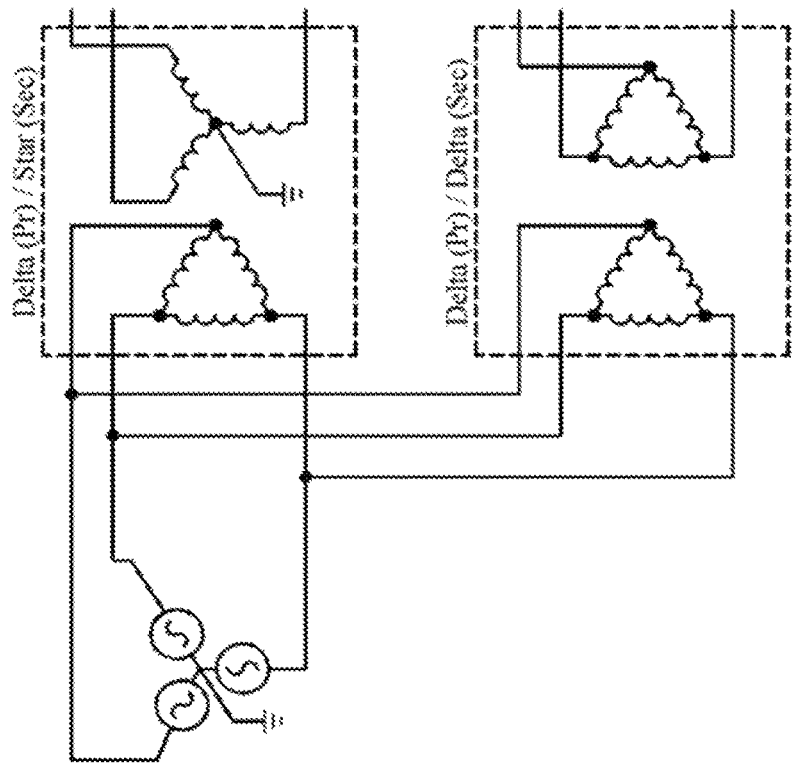

In some embodiments, exhibits shown in FIG. 27 and FIG. 28 can also be established with various core arrangements 700, 800 and 900 shown in FIGS. 25A, 25B and 25C. In some embodiments, the various filter transformers described herein including the delta/modified star configuration may be used for phase-shifting application and used for mitigating higher order harmonics. For example, generally power transfer systems use delta/delta transformers in parallel with delta-wye transformers to mitigate $5^{th}$ and $7^{th}$ harmonics as shown in FIG. 29A. In some embodiments, a power transfer system for reducing higher order harmonics may include a delta/modified star transformer in parallel with wye/modified star transformer as shown in FIG. 29B. The system of FIG. 29B may enable much more efficient operation since the same phase shifting is established while removing triplen harmonics from the high side instead of being trapped in the delta windings.

Figure 30:
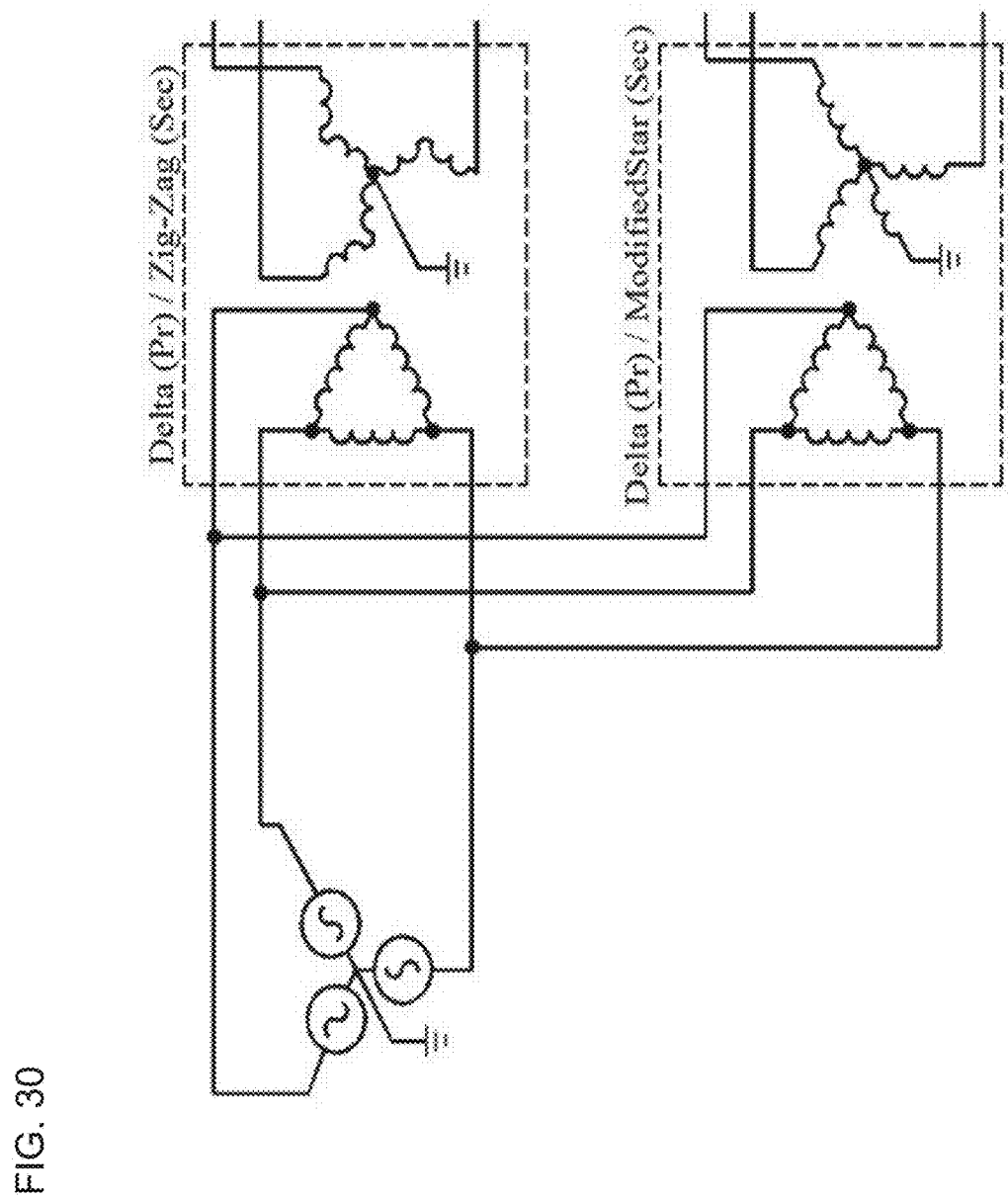
FIG. 30 is a simplified circuit diagram of a three phase system including phase-shifting using a transformer having a delta/modified star configuration so as to mitigate triplen, $11^{th}$ and $13^{th}$ harmonics.

In some embodiments, $11^{th}$ and $13^{th}$ order harmonics may also be mitigated using a combination of a delta/zig-zag transformer and a delta/modified star transformer in parallel as shown in FIG. 30.

In some embodiments, the two parallel transformers may be combined into one. In such embodiments, the transformer may include two secondary windings on top of each other as well as two outputs. For example, the star/modified star transformer and the delta/modified star transformer shown in FIG. 29B may be combined on a single core. Similarly, the delta/zig-zag transformer and the delta/modified star transformer of FIG. 30 may be combined on a single core.

Figure 31A:
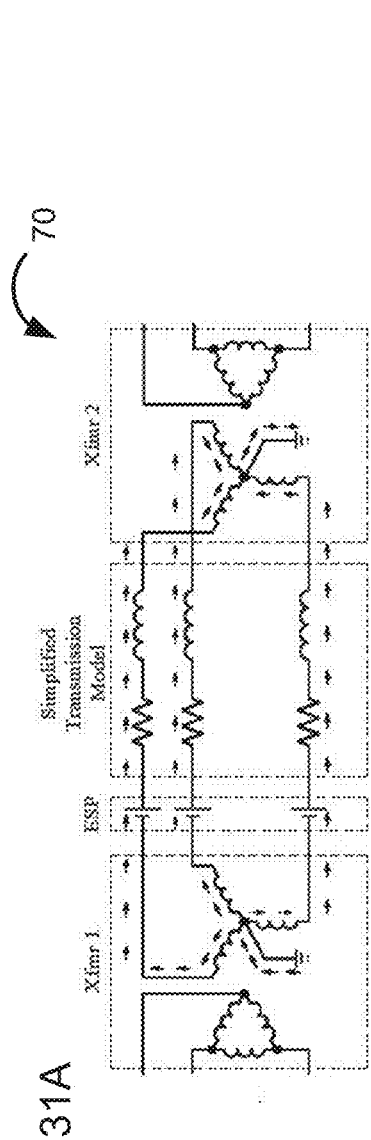
FIG. 31A is a simplified circuit diagram of a power transfer system experiencing ESP.

In some embodiments, one or more of the transformers described herein may be used to mitigate ESP as well as harmonics in a power transfer system. For example, FIG. 31A is a simplified circuit diagram of a power transmission system 70 which includes a first transformer (Xfmr 1), a second transformer (Xfmr 2) coupled together via transmission lines. The power transmission system may experience ESP induced GIC downstream of the first transformer and upstream of the transmission lines. FIG. 31A shows the flow of the GIC through the system 70.

Figure 31B:
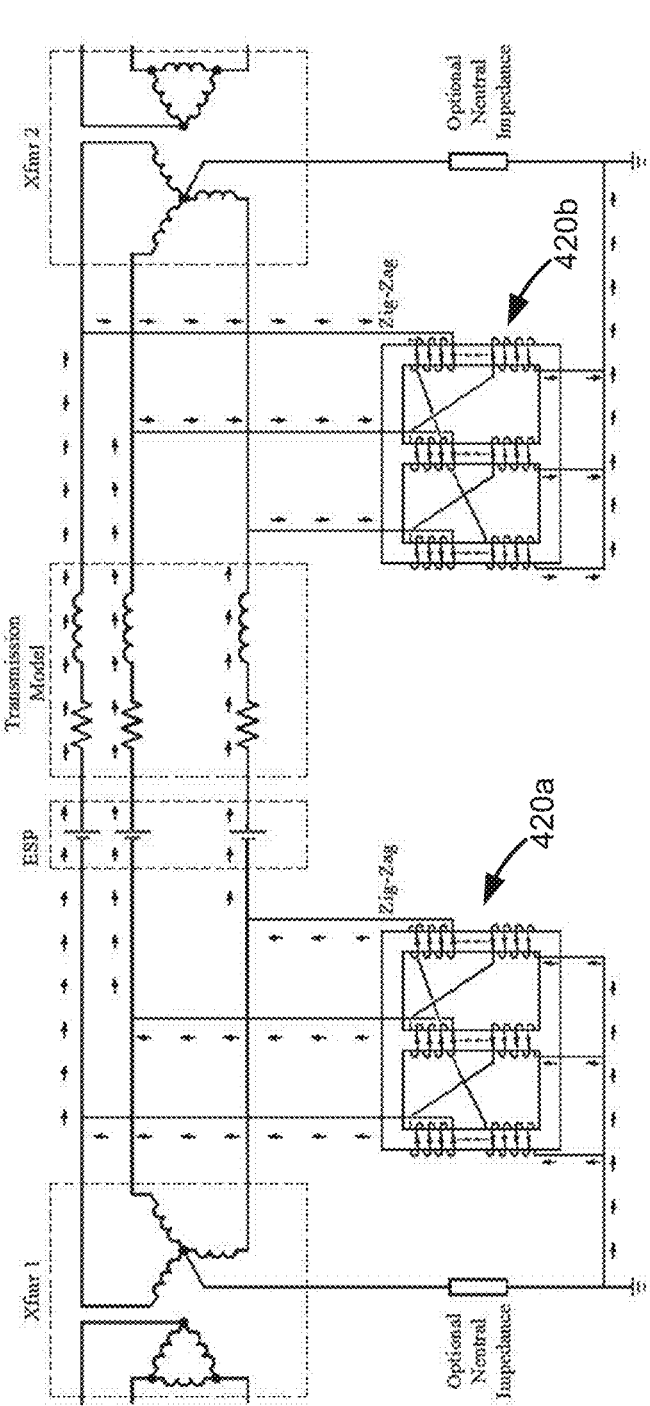
FIG. 31B shows the power transfer system of FIG. 31A including a first zig-zag filter transformer positioned upstream of the ESP source to mitigate ESP and a second zig-zag filter transformer positioned downstream of the ESP source to mitigate harmonics.

To mitigate the ESP, a first zig-zag transformer 400a which is substantially the same as the zig-zag transformer 400 described before herein with respect to the FIG. 22, is positioned in parallel with the first transformer and the ESP as shown in FIG. 31B. Furthermore, a second zig-zag transformer 400b which is also substantially the same as the zig-zag transformer 400 described before herein, is positioned in parallel with the second transformer and the ESP. The zig-zag transformers 400a/b enable the GIC to flow between the two ends of the line by introducing very low zero sequence impedance. Consequently, GIC is re-routed through the zig-zag transformers 400a/b rather than the transmission power transformers.

Furthermore, the second zig-zag transformer 400b may also serve to mitigate harmonics (e.g., triplen harmonics) as described before herein. While FIG. 31B shows a zig-zag transformer 400 being used for simultaneous GIC and harmonic mitigation, in various embodiment any of the filter transformers described herein (e.g., the filter transformer 500, 500a, 600, 700, 800, 900, 1000, 1100 or 1200) may be used in place, in addition to or in combination with the zig-zag transformers 400*a/b* for GIC and harmonic mitigation in the power transfer system 70 or any other power transfer system described herein.

Section III: Grounding Transformers

A key concern in some power systems such wind farms is power grounding. Generally, substations for collecting and transferring power from wind turbines do not include a reference ground. This may lead to instability in the voltage transfer signal, insulation failure, and/or failure to detect ground faults. In some embodiments, a grounding transformer may be included in transmission line coupling a plurality of wind turbines included in a wind farm to a step up substation so as to provide a stable and reliable ground. It is to be appreciated that while embodiments of the grounding transformer described herein are described with respect to a wind farm, the grounding transformer may be used in any other power generation or transfer system, for example utility distribution systems and/or industrial applications such as mining or oil industry power systems.

Figure 32:
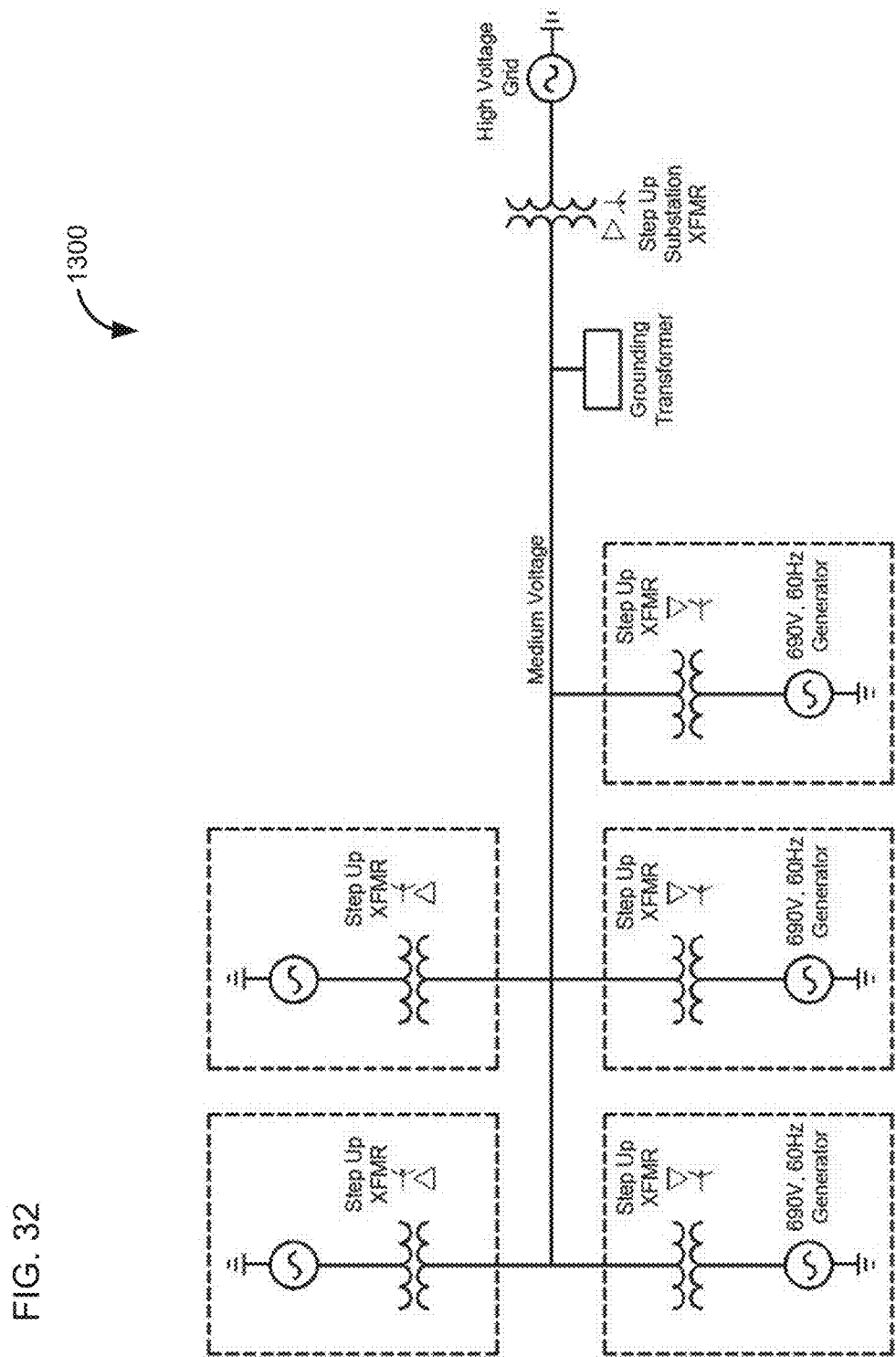
FIG. 32 is a simplified circuit diagram of wind farm including five wind turbines arranged in a star/delta configuration and including a grounding transformer.
Figure 33:
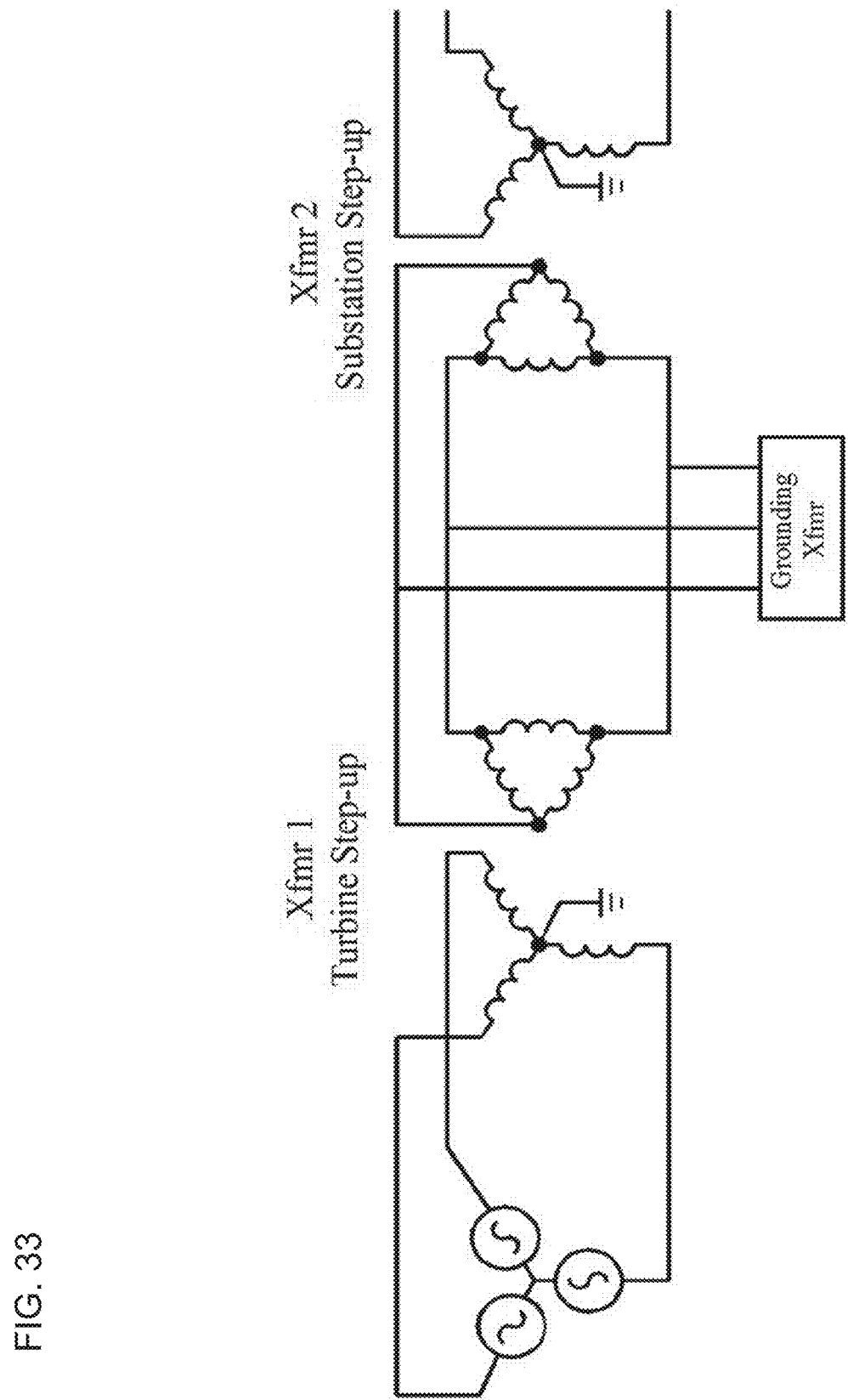
FIG. 33 is a simplified circuit diagram of a power transfer system from a wind turbine including a first step-up transformer, a substation step-up transformer and a ground transformer.

For example, FIG. 32 shows a power generation system 1300 including a plurality of wind turbines ("generators") coupled to a step up transformers feeding to a step up substation transformer via one or more electric lines. A grounding transformer is coupled to the electric lines so as to provide a stable and reliable ground. FIG. 33 is a simplified circuit diagram of a possible configuration of coupling the grounding transformer to the wind turbine system. In some embodiments, the grounding transformer may include a zig-zag transformer (e.g., the zig-zag transformer 420 described before herein). However, any other transformer or grounding schemes described herein may be used to achieve grounding of the power generation system 1300 or any other power generation system (e.g., the filter transformers and configurations described with respect to FIGS. 22-28).

While this specification contains many specific implementation details, these should not be construed as limitations on the scope of any embodiments or of what may be claimed, but rather as descriptions of features specific to particular implementations of particular embodiments. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings and tables in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated in a single software product or packaged into multiple software products.

Thus, particular implementations of the disclosure have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present disclosure.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A transformer assembly, comprising:
   at least one transformer, comprising:
      a core,
      a primary winding positioned on a first portion of the core,
      a secondary winding positioned on a second portion of the core, and
      a neutral winding positioned on a third portion of the core,
      wherein the secondary winding receives an induced flux produced by an earth surface potential (ESP) via a system ground, the induced flux having a first direction, and
      wherein the neutral winding is configured to provide a mitigating flux to the secondary winding, the mitigating flux having a second direction opposing the first direction of the induced flux so as to mitigate the induced flux.

2. The transformer assembly of claim 1, wherein the core comprises:
   at least one primary leg; and
   at least one secondary leg,
   wherein the first portion is located on the at least one primary leg, the second portion is located on the at least one secondary leg, and the third portion is also located on the at least one secondary leg.

3. The transformer assembly of claim 1, further comprising:
   a voltage source electrically coupled to the neutral winding,
   wherein the voltage source is configured to produce the mitigating flux.

4. The transformer assembly of claim 1, wherein the secondary winding is wound in a second rotational direction on the second portion of the core, and wherein the neutral winding is wound in a third rotational direction opposite the second rotational direction, and wherein the neutral winding is electrically coupled to the system ground so as to also receive the ESP therefrom, the ESP producing the mitigating flux in the neutral winding.

5. The transformer assembly of claim 4, further comprising:
   a switch positioned within an electrical line coupling the neutral winding to the system ground,
   wherein the switch is configured to selectively couple the neutral winding to the system ground.

6. The transformer assembly of claim 4, wherein the neutral winding has one third the number of windings as the secondary winding.

7. The transformer assembly of claim 1, wherein the core comprises:
   at least one primary leg;
   at least one secondary leg positioned parallel to the at least one primary leg; and
   at least one yoke positioned orthogonal to each of the at least one primary leg and the at least one secondary leg;
   wherein the first portion is located on the at least one primary leg, the second portion is located on the at least one secondary leg, and the third portion is also located on the at least one yoke.

8. A power transfer system, comprising:
   an electric source;
   an electric load;
   an step down transformer electrically coupling the electric source to the electric load via electric lines, the step down transformer configured to reduce a first voltage provided by the electric source to a second voltage compatible with an operational voltage of the electric load;
   a filter transformer comprising:
      at least one core;
      at least one primary winding positioned on a first portion of the at least one core, the at least one primary winding electrically coupled to the electric lines between the step down transformer and the electric load; and
      at least one neutral winding positioned on a second portion of the at least core, the at least one secondary winding electrically coupled to the primary winding and a system ground,
      wherein, the filter transformer is configured to provide a low impedance path so as to allow harmonics to circulate between the filter transformer and the load instead of flowing into the step down transformer.

9. The power transfer system of claim 8, wherein each of the at least one core of the filter transformer comprises:
   a plurality of legs positioned parallel to each other,
   wherein each of the at least one primary winding and the at least one secondary winding is positioned on each of the plurality of legs.

10. The power transfer system of claim 9, wherein the filter transformer includes a plurality of primary windings serially coupled to each other, and wherein the filter transformer also includes a plurality of secondary windings serially coupled to each other.

11. The power transfer system of claim 8, wherein the at least one neutral winding is a first neutral winding, and wherein the filter transformer further comprises:
   a second neutral winding positioned on a third portion of the at least one core,
   wherein the second neutral winding is electrically coupled to a system ground.

12. The power transfer system of claim 11, wherein the at least one core of the filter transformer comprises:
   at least one primary leg, the first portion located on the at least one primary leg;
   at least one secondary leg positioned parallel to the at least one primary leg, the second portion located on the at least one secondary leg; and
   at least one yoke positioned orthogonal to each of the at least one primary leg and the at least one secondary leg, the third portion located on the at least one yoke.

13. The power transfer system of claim 8, wherein the at least one core of the filter transformer comprises:
   a pair of legs; and
   a pair of yokes positioned orthogonal to the pair of legs at opposite ends of the pair of legs,
   wherein the at least one primary winding is positioned on a yoke of the pair of yokes, and wherein the at least one neutral winding is positioned on a leg of the pair of legs.

14. The power transfer system of claim 8, wherein the at least one core of the filter transformer comprises a plurality of legs, and wherein the filter transformer includes a plurality of primary windings,
   wherein each of the plurality of primary windings are wound on a first leg of the plurality of legs, the plurality of primary windings wound on top of each other so as to be concentric to each other, and
   wherein the at least one neutral winding is wound on the top of the plurality of primary windings so as to be concentric with the primary windings.

15. The power transfer system of claim 8, wherein the at least one core of the filter transformer comprises a plurality of legs, and wherein the filter transformer includes a plurality of primary windings, wherein a first portion of the plurality of primary windings is wound on a first leg of the plurality of legs on top of each other so as to be concentric to each other, and a second portion of the plurality of primary windings is wound on a second leg of the plurality of legs so as to be concentric to each other, and wherein the at least one neutral winding is wound on the top of the second portion of the plurality of primary windings so as to be concentric with the second portion of the plurality of primary windings and positioned on the second leg.

16. The power transfer system of claim 8, wherein the at least one core of the filter transformer includes a circular core.

17. The power transfer system of claim 16, wherein the filter transformer includes a plurality of primary windings wound on top of each other about a circumference of the circular core so as to be concentric to the circular core and to each other, and wherein the at least one neutral winding is wound about the plurality of primary windings so as to be concentric to the primary windings and the circular core.

18. The power transfer system of claim 16, wherein the filter transformer includes a plurality of primary winding, each of the plurality of primary windings and the at least one neutral windings wound about the circular core at different locations thereof.

19. The power transfer system of claim 16, wherein the filter transformer includes a plurality of cores along with associated plurality of primary windings, stacked up on top of each other, each of the plurality of primary windings and the at least one neutral windings wound about the circular core(s) at different locations thereof.

20. The power transfer system of claim 16, wherein the filter transformer includes a zig-zag winding scheme using similar design as claim 19 with plurality of cores along with associated plurality of primary windings, stacked up on top of each other, each of the plurality of primary windings and the at least one neutral windings wound about the circular core(s) at different locations thereof.

\* \* \* \* \*